United States Patent
Lee et al.

(10) Patent No.: US 10,054,733 B2
(45) Date of Patent: Aug. 21, 2018

(54) LIGHT EMITTING DEVICE PACKAGE AND DISPLAY DEVICE INCLUDING THE SAME

(71) Applicant: SAMSUNG ELECTRONICS CO., LTD., Suwon-si (KR)

(72) Inventors: Kye Hoon Lee, Suwon-si (KR); Dae Kuen Yang, Suwon-si (KR); Nae-won Jang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 14/804,801

(22) Filed: Jul. 21, 2015

(65) Prior Publication Data

US 2016/0033715 A1   Feb. 4, 2016

(30) Foreign Application Priority Data

Jul. 30, 2014 (KR) ........................ 10-2014-0097302

(51) Int. Cl.
| | |
|---|---|
| *F21V 9/00* | (2018.01) |
| *F21V 8/00* | (2006.01) |
| *G02F 1/13357* | (2006.01) |
| *H01L 33/58* | (2010.01) |
| *H01L 33/50* | (2010.01) |
| *H01L 25/075* | (2006.01) |
| *H01L 33/60* | (2010.01) |

(52) U.S. Cl.
CPC ......... *G02B 6/0073* (2013.01); *G02F 1/1336* (2013.01); *H01L 33/504* (2013.01); *H01L 33/58* (2013.01); *H01L 25/0753* (2013.01); *H01L 33/60* (2013.01); *H01L 2224/16245* (2013.01); *H01L 2224/48091* (2013.01); *H01L 2224/48247* (2013.01); *H01L 2224/48257* (2013.01); *H01L 2924/181* (2013.01)

(58) Field of Classification Search
None
See application file for complete search history.

(56) References Cited

U.S. PATENT DOCUMENTS

| 8,981,415 B1 | 3/2015 | Hsu et al. |
| 2004/0075100 A1 | 4/2004 | Bogner et al. |

(Continued)

FOREIGN PATENT DOCUMENTS

| CN | 1809934 A | 7/2006 |
| CN | 102427075 A | 4/2012 |

(Continued)

OTHER PUBLICATIONS

Communication dated Mar. 27, 2017, issued by the European Patent Office in counterpart European Patent Application No. 15176582.3.

(Continued)

*Primary Examiner* — Andrew Coughlin
(74) *Attorney, Agent, or Firm* — Sughrue Mion, PLLC

(57) ABSTRACT

Disclosed herein is a light emitting device package including a light emitting device configured to generate a first light; a body configured to accommodate the light emitting device and comprising a cavity in the body; an optical member configured to divide the cavity into a plurality of cavities including a first cavity and a second cavity; and first phosphor and second phosphor different from the first phosphor accommodated in the first and the second cavities, respectively.

31 Claims, 24 Drawing Sheets

(56) References Cited

U.S. PATENT DOCUMENTS

| | | | |
|---|---|---|---|
| 2008/0093978 A1* | 4/2008 | Mori | B82Y 20/00 |
| | | | 313/498 |
| 2010/0025700 A1* | 2/2010 | Jung | H01L 25/0753 |
| | | | 257/89 |
| 2010/0090231 A1 | 4/2010 | Jung et al. | |
| 2010/0148200 A1 | 6/2010 | Lai et al. | |
| 2011/0186867 A1 | 8/2011 | Singer et al. | |
| 2011/0291114 A1* | 12/2011 | Cheng | H01L 25/0753 |
| | | | 257/88 |
| 2011/0298387 A1 | 12/2011 | Kaneda et al. | |
| 2011/0316017 A1 | 12/2011 | Liu et al. | |
| 2012/0214264 A1* | 8/2012 | Lin | H01L 33/504 |
| | | | 438/27 |
| 2015/0091034 A1* | 4/2015 | Hsu | H01L 33/504 |
| | | | 257/98 |

FOREIGN PATENT DOCUMENTS

| | | |
|---|---|---|
| JP | 2012-199539 A | 10/2012 |
| KR | 10-2011-0108147 A | 1/2001 |
| KR | 10-2010-0030805 A | 3/2010 |
| KR | 10-2010-0042126 A | 4/2010 |
| KR | 10-2013-0014254 A | 2/2013 |

OTHER PUBLICATIONS

Communication (PCT/ISA/210) dated Sep. 17, 2015 by the International Searching Authority in International Application No. PCT/KR2015/006361.

Communication dated Nov. 26, 2015 by the European Patent Office in EP Application No. 15176582.3.

Communication dated Oct. 10, 2016, issued by the European Patent Office in counterpart European Patent Application No. 15176582.3.

Communication dated Jan. 22, 2018, from the European Patent Office in counterpart European Application No. 15176582.3.

Communication dated May 25, 2018 by the State Intellectual Property Office of P.R. China in counterpart Chinese Patent Application No. 201510455411.4.

Communication dated Jun. 19, 2018 by the European Patent Office in counterpart European Patent Application No. 15176582.3.

* cited by examiner

LIGHT EMITTING DEVICE PACKAGE AND DISPLAY DEVICE INCLUDING THE SAME

CROSS-REFERENCE TO RELATED APPLICATION

This application claims priority from Korean Patent Application No. 10-2014-0097302, filed on Jul. 30, 2014 in the Korean Intellectual Property Office, the disclosure of which is incorporated herein by reference in its entirety.

BACKGROUND

1. Field

Apparatuses consistent with exemplary embodiments relate to a light emitting device package and a display device including the same.

2. Description of Related Art

A light emitting device, such as Light Emitting Diode (LED) is a semiconductor device capable of emitting various colors of light by including a light emitting source formed by p-n junction of compound semiconductor.

A method for emitting white light includes a method of synthesizing the white light by using a three-color light-emitting device and a method of synthesizing the white light by using a single blue light emitting device and a yellow phosphor, or a blue light emitting device and a red and green phosphor.

When synthesizing the white light by using a three-color light-emitting device, there is an advantage in that the color reproduction range is wide. However, because the electrical characteristics of the respective light emitting devices are different, the driving circuit is complicated. Further, uniformity of color may not be guaranteed because changes of each light emitting device characteristics are different from one another when using three-color light-emitting device.

When synthesizing the white light by using a single blue light emitting device and a yellow phosphor, or a blue light emitting device and a red and green phosphor, there is an advantage in that a driving circuit is simplified because a single blue light emitting device is used as a light source. However, there may be difficulties of designing a certain chromaticity because the color reproduction range is narrow, and the color reproducibility may be reduced because a light excited by a green phosphor excites a red phosphor.

SUMMARY

Therefore, exemplary embodiments provide a light emitting device package in which phosphor different from each other is accommodated in divided cavities, and a display device having the same.

Additional aspects of the exemplary embodiments will be set forth in part in the description which follows and, in part, will be obvious from the description, or may be learned by practice of the invention.

In accordance with an aspect of an exemplary embodiment, there is provided a light emitting device package including a light emitting device generating a light, a body accommodating the light emitting device, an optical member dividing the body into a plurality of cavities, and phosphor different from each other accommodated in each of the plurality of cavities.

The phosphor different from each other may emit a light having wavelength different from each other.

The phosphor different from each other may include at least one phosphor selected from a group including green light emitting phosphor and red light emitting phosphor.

The green light emitting phosphor may include at least one selected from a group including nitride-based phosphor, sulfide-based phosphor, silicate-based phosphor, and quantum dot-based phosphor.

The red light emitting phosphor may include at least one selected from a group including nitride-based phosphor, sulfide-based phosphor, fluorinated-based phosphor, and quantum dot-based phosphor.

The phosphor may have a shape mixed with molding member including silicon.

The light emitting device may be disposed on a lower portion of the optical member.

The light emitting device may be accommodated in at least one cavity among the plurality of cavities.

The light emitting device may generate a blue light.

The optical member may be non-phosphor optical member formed in a transparent or haze type.

A coating layer including titanium oxide ($TiO_2$) may be formed on a surface of the cavity.

In accordance with an aspect of another exemplary embodiment, there is provided a display device including a liquid crystal panel, a light guide plate provided in a lower portion of the liquid crystal panel, and at least one light emitting device package provided on a side of the light guide plate, wherein the light emitting device package may include a light emitting device generating a light, a body accommodating the light emitting device, an optical member dividing the body into a plurality of cavities, and phosphor different from each other accommodated in each cavity of the plurality of cavities.

The phosphor different from each other may emit a light having wavelength different from each other.

The phosphor different from each other may include at least one phosphor selected from a group including green light emitting phosphor and red light emitting phosphor.

The green light emitting phosphor may include at least one selected from a group including nitride-based phosphor, sulfide-based phosphor, silicate-based phosphor, and quantum dot-based phosphor.

The red light emitting phosphor may include at least one selected from a group including nitride-based phosphor, sulfide-based phosphor, fluorinated-based phosphor, and quantum dot-based phosphor.

In accordance with an aspect of another exemplary embodiment, there is provided a light emitting device package including: a light emitting device configured to generate a first light; a body configured to accommodate the light emitting device and including a cavity in the body; an optical member configured to divide the cavity into a plurality of cavities including a first cavity and a second cavity; and first phosphor and second phosphor different from the first phosphor accommodated in the first and the second cavities, respectively.

The second phosphor may be configured to emit a third light having wavelength different from a second light from the first phosphor.

The first phosphor or the second phosphor may include at least one of green light emitting phosphor and red light emitting phosphor.

The green light emitting phosphor may include at least one of nitride-based phosphor, sulfide-based phosphor, silicate-based phosphor, and quantum dot-based phosphor.

The red light emitting phosphor may include at least one of nitride-based phosphor, sulfide-based phosphor, fluorinated-based phosphor, and quantum dot-based phosphor.

The light emitting device package may further include a molding member including silicon and provided in the cavity, wherein the first and the second phosphor may be mixed in the molding member and a light emitting surface of the molding member has a shape.

The optical member may be provided on a light emitting surface of the light emitting device.

The light emitting device may be accommodated in at least one cavity among the plurality of cavities.

The light emitting device may be configured to generate a blue light.

The optical member may include a non-phosphor optical member being a transparent type optical member or a haze type optical member.

The body may include a coating layer including titanium oxide (TiO2) provided on an inner surface of the body forming the cavity.

The light emitting device may include a plurality of light emitting devices including: a first light emitting device; and a second light emitting device, and wherein the first and the second light emitting devices are provided in the first and the second cavities, respectively.

The light emitting device package may further include a lead frame configured to form the cavity with the body, wherein the light emitting device is electrically connected to the lead frame via a bonding wire.

In accordance with an aspect of another exemplary embodiment, there is provided a display device including: a liquid crystal panel; a light guide plate provided behind the liquid crystal panel; and at least one light emitting device package provided on a side of the light guide plate, wherein the light emitting device package may include: a light emitting device configured to generate a light; a body configured to accommodate the light emitting device and including a cavity in the body; an optical member configured to divide the body into a plurality of cavities including a first cavity and a second cavity; and first phosphor and second phosphor different from the first phosphor accommodated in the first and the second cavities, respectively.

In accordance with an aspect of another exemplary embodiment, there is provided a light emitting device package including: a light emitting device configured to generate a light having a first wavelength; a body including a cavity in the body; an optical member provided in the body, configured to divide the cavity into a plurality of cavities including a first cavity and a second cavity and configured to emit the light in the first wavelength; first phosphor provided in the first cavity and configured to emit a light having a second wavelength different from the first wavelength; and second phosphor provided in the second cavity and configured to emit a light having a third wavelength different from the first and the second wavelengths.

The light having the first wavelength, the light having the second wavelength and the light having the third wavelength may be combined to generate a white light.

The first phosphor may be provided only in the first cavity amongst the plurality of cavities, and the second phosphor may be provided only in the second cavity amongst the plurality of cavities.

In accordance with an aspect of another exemplary embodiment, there is provided a light emitting device package including: a light emitting device configured to generate a light having a first wavelength; a body including a cavity in the body; an optical member provided in the body, configured to divide the cavity into a plurality of cavities including a first cavity and a second cavity and configured to emit the light in the first wavelength; a molding member including a resin material provided in the cavity; first phosphor mixed with the molding member in the first cavity and configured to emit a light having a second wavelength different from the first wavelength; and second phosphor mixed with the molding member in the second cavity and configured to emit a light having a third wavelength different from the first and the second wavelengths.

BRIEF DESCRIPTION OF THE DRAWINGS

The above and/or other aspects of the disclosure will become apparent and more readily appreciated from the following description of embodiments, taken in conjunction with the accompanying drawings of which.

DETAILED DESCRIPTION

Reference will now be made in detail to exemplary embodiments of the present disclosure, examples of which are illustrated in the accompanying drawings.

Figure 1:
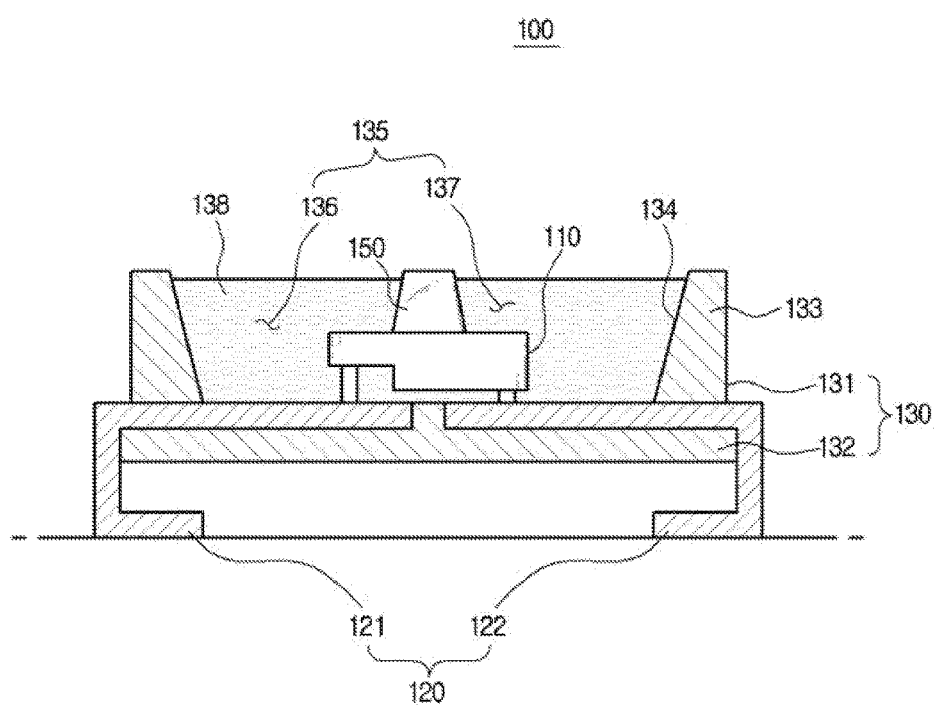
FIG. 1 is a cross-sectional view illustrating a light emitting device package in accordance with an exemplary embodiment.
Figure 2:
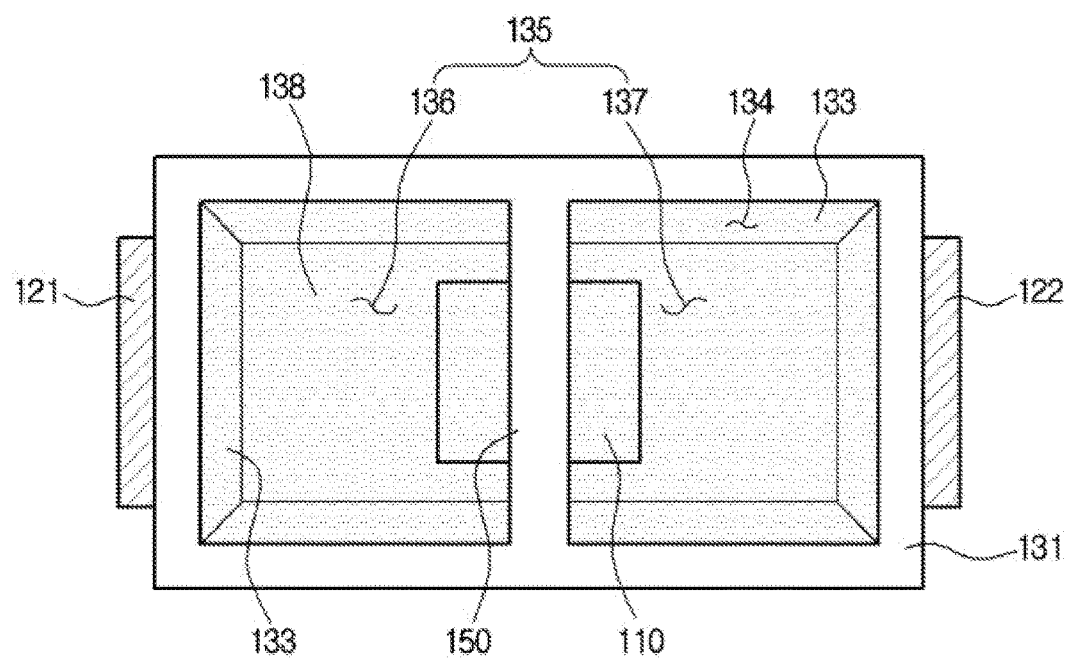
FIG. 2 is a top view illustrating a light emitting device package of FIG. 1.

FIG. 1 is a cross-sectional view illustrating a light emitting device package 100 in accordance with an exemplary embodiment, and FIG. 2 is a top view illustrating the light emitting device package 100 of FIG. 1 in accordance with an exemplary embodiment.

Referring to FIGS. 1 and 2, a light emitting device package 100 includes a light emitting device 110 generating a light, a lead frame 120 electrically connected to the light emitting device 110 and forming at least a portion of a lower surface forming a cavity 135, a body 130 in which the light emitting device 110 and a plurality of cavities 135 are formed, and an optical member 150 dividing the cavity 135 into the plurality of cavities 136 and 137.

The light emitting device 110 may include different components configured to generate a light. For example, the light emitting device 110 may include at least one light emitting diode.

A light emitting diode having a laminated compound semiconductor structure having p-n junction structure may include a n-type semiconductor layer, a p-type semiconductor layer, and an active layer provided between the n-type semiconductor layer and the p-type semiconductor layer.

When a forward electric field is applied to the n-type and p-type semiconductor layers, the light emitting diode may generate a light by a phenomenon in which electrons and holes are injected into the active layer provided between the n-type and p-type semiconductor layers and the injected electrons and holes emit a light by the recombination of the electrons and the holes.

The light emitting device 110 may be a light emitting device outputting a single colored light, such as a red, a green, a blue, and a white wavelength band, or may be an ultra violet (UV) light emitting device outputting ultraviolet rays. However, the exemplary embodiment is not limited thereto.

The light emitting diode may be classified into laterally structured light emitting diodes and vertically structured light emitting diodes. The laterally structured light emitting diodes may be classified into one of "Top-Emitting light emitting diodes" and "Flip-Chip light emitting diodes."

The Flip-Chip light emitting diode is configured to emit a light through a sapphire substrate. For example, the light emitting diode according to an exemplary embodiment may be attached on a sub-mount, e.g., the lead frame 120, via die attach process and a light generated in the light emitting diode may be emitted through one surface of the diode which is not attached on the sub-mount via the die attach process.

Figure 3:
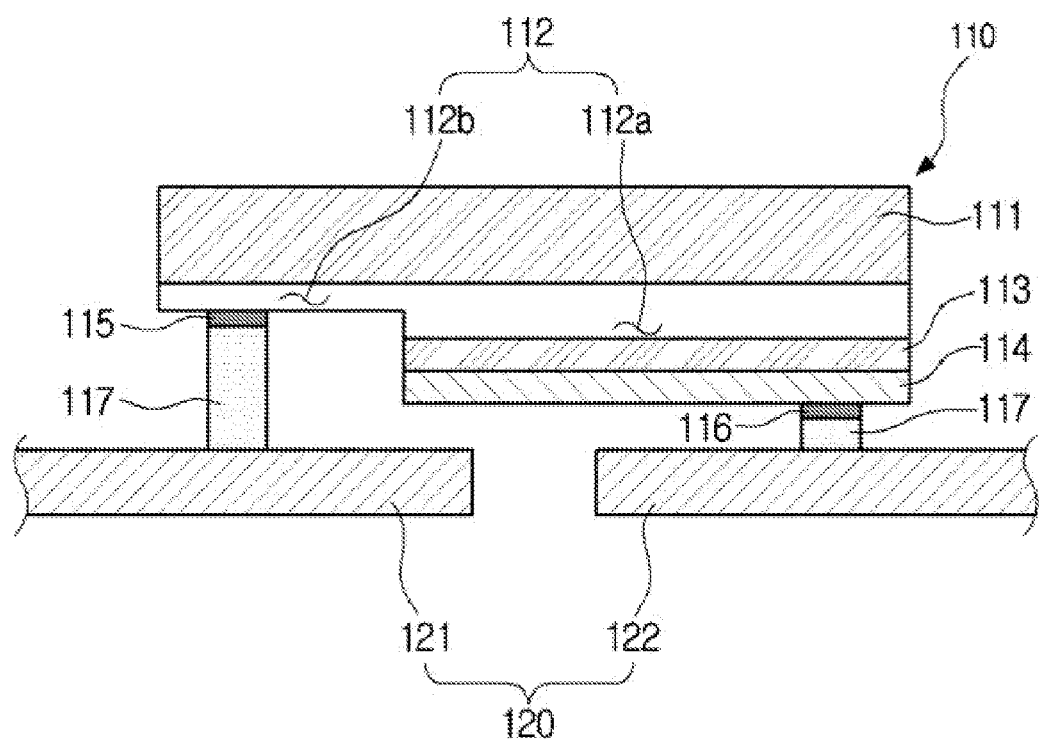
FIG. 3 is a view illustrating a configuration of a light emitting device in accordance with an exemplary embodiment.

Hereinafter a structure of a light emitting device 110 will be described with a flip-chip light emitting diode according to an exemplary embodiment. FIG. 3 is a view illustrating a configuration of a light emitting device 110 in accordance with an exemplary embodiment.

Referring to FIG. 3, the light emitting device 110 may have a structure, for example, in which a substrate 111, a n-type semiconductor layer 112, an active layer 113, and a p-type semiconductor layer 114 are stacked in that order.

The substrate 111 may be formed by using transparent material including sapphire, or may be formed of zinc oxide (ZnO), gallium nitrice (GaN), silicon carbide (SiC), aluminium nitride (AlN) and the like other than sapphire.

A buffer layer (not shown) may be formed between the substrate 111 and the n-type semiconductor layer 112. However, the buffer layer (not shown) configured to improve a lattice matching with the substrate 111 before growing the n-type semiconductor layer 112 on the substrate 111 may be omitted depending on the process conditions or device characteristics.

The n-type semiconductor layer 112 may be formed of semiconductor materials having a chemical formula of $In_X Al_Y Ga(1-X-Y)N$ ($0 \leq X$, $0 \leq Y$, $X+Y \leq 1$). Particularly, the n-type semiconductor layer 112 may include a GaN layer or a GaN/AlGaN layer in which n-type conductive impurity, such as silicon (Si), germanium (Ge), tin (Sn), and the like, is doped.

The n-type semiconductor layer 112 may be divided into a first area 112a and a second area 112b, and the first area 112a may be defined as a light emitting surface. An area of the first area 112a may be larger than that of the second area 112b so that optical characteristics of the light emitting device 110 may be improved.

In the first area 112a, the active layer 113 and the p-type semiconductor layer 114 are stacked on one another.

The active layer 113 may include a InGaN/GaN layer having Multi-Quantum Well structure.

The p-type semiconductor layer 114 may be formed of semiconductor materials having a chemical formula of $In_X Al_Y Ga(1-X-Y)N$ ($0 \leq X$, $0 \leq Y$, $X+Y \leq 1$). Particularly, the p-type semiconductor layer 114 may include a GaN layer or a GaN/AlGaN layer in which p-type conductive impurity, such as magnesium (Mg), zinc (Zn), beryllium (Be), and the like, is doped.

On the n-type semiconductor layer 112, n-type electrodes 115 are formed, and on the p-type semiconductor layer 114, p-type electrodes 116 are formed.

An adhesive layer 117 may have a structure in which a plurality of metal layer formed of a single element is stacked, and may include reflective material to prevent the reflectance of the lead frame 120 affecting characteristics of the light emitting device 110. For example, the adhesive layer 117 may be formed of metal containing tin (Sn), or silver (Ag).

In FIG. 3, a case where the n-type semiconductor layer 112 is provided on an upper portion the light emitting device 110 and the p-type semiconductor layer 114 is disposed on a lower portion the light emitting device 110 is described as an exemplary embodiment, but the p-type semiconductor layer 114 may be provided on an upper portion the light emitting device 110 and the n-type semiconductor layer 112 may be disposed on a lower portion the light emitting device 110.

One or more the light emitting device 110 may be mounted, but in the exemplary embodiment, a case where one light emitting device 110 is mounted may be described as an example.

Referring back to FIG. 1, the lead frame 120 forms a bottom surface of the cavity 135 to play a role of reflecting a light generated in the light emitting device 110 while supplying an external power to the light emitting device 110.

The lead frame 120 may be formed to have a single layer structure or a multiple layer structure, and as illustrated in drawings, two lead frames 120 or three or more lead frames 120 may be used.

Hereinafter a case where the lead frame 120 is formed to have a single layer structure and configured to include a first lead frame 121 and a second lead frame 121 will be described as an exemplary embodiment. Referring back to FIGS. 1 and 2, one side (e.g., an upper portion as shown in the figures) of the first lead frame 121 and the second lead frame 122 may be inserted into an area provided between an upper body 131 and a lower body 132, and the other side (e.g., a lower portion) may surround the lower body 132.

The light emitting device 110 may be attached on an upper portion of the first lead frame 121, an upper portion of the second lead frame 122, or may be attached across the upper portions of both the first lead frame 121 and the second lead frame 122.

When the light emitting device 110 is attached on the upper portion of the first lead frame 121 or on the upper portion of the second lead frame 122, the light emitting device 110 may be electrically connected to the second lead frame 122 or the first lead frame 121 through a wire bond (not shown). When the light emitting device 110 is attached across the upper portions of the first lead frame 121 and the second lead frame 122, the light emitting device 110 may be attached on an upper surface of each lead frame 120 by the adhesive layer 117 as shown in FIG. 3.

The lead frame 120 may include at least one metal selected from a group including Titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe).

The first lead frame 121 and the second lead frame 122 may be spaced apart from each other so as to be electrically separated. Each of the first lead frame 121 and the second lead frame 122 of the lead frame 120 may form at least a portion of a lower (i.e., a bottom) surface of the cavity 135.

The body 130 may support and protect the light emitting device 110, and may include the upper body 131 and the lower body 132.

The body 130 may be formed of at least one of resin material, such as Polyphthalamide (PPA), silicon (Si), aluminum (Al), aluminum nitride (AlN), photo sensitive glass PSG), polyamide 9T (PA9T), syndiotactic polystyrene (SPS), metal materials, sapphire (Al2O3), beryllium oxide (BeO), and a printed circuit board (PCB).

The body 130 may be manufactured by an injection molding, an etching process. However, the exemplary embodiment is not limited thereto.

In the upper body 131, the plurality of cavities 135 are formed in a concave manner having a diameter that gradually decreases while proceeding from an upper portion to a lower portion of the upper body 131. In addition, the lead frame 120, which forms the bottom surface of the cavity 135, is exposed inside the cavity 135. A width and a height of the cavity 135 may be formed to be larger than a width and a height of the light emitting device 110. However, the exemplary embodiment is not limited thereto. Hereinafter a case where two cavities 135 are formed will be described as an exemplary embodiment.

The upper body 131 includes a wall portion 133 surrounding the plurality of cavities 136 and 137 as shown in FIG. 2.

An inner surface of the wall portion 133 may be formed to be inclined from the upper portion to the lower portion. According to an angle of the inclined surface, a reflection angle of a light emitted from the light emitting device 110 may be varied, and thus beam angle of the light emitted from the light emitting device 110 may be adjusted.

As the beam angle of the light is reduced, convergence of the light emitted from the light emitting device 110 to the outside may be increased, and on the contrary as the beam angle of the light is increased, convergence of the light emitted from the light emitting device 110 to the outside may be decreased.

Reflective material may be applied on the inner surface 134 of the wall portion 133 to reflect a light generated in the light emitting device 110, a description thereof will be described later.

A molding member 138 surrounding the light emitting device 110 to protect from foreign object may be filled inside the cavity 135.

The molding member 138 filled in each cavity 135 may have a shape in a way that the molding member 138 covers a side surface of the light emitting device 110, and thus the light emitting device 110 may be separated from the outside to prevent the damage from foreign object from the exterior of the light emitting device package 100.

The molding member 138 filled in the cavity 135 may be formed to have an upper portion thereof a convex shape, a flat shape or a concave shape. When the upper portion of the molding member 138 has a concave shape, beam angel of the light outputted to the outside may be decreased and convergence of the light may be increased. When the upper portion of the molding member 138 has a convex shape, beam angel of the light outputted to the outside may be increased and convergence of the light may be decreased. That is, the convergence of the light may be controlled by the shape of the upper portion of the molding member 138.

The molding member 138 may be formed of material having high water tightness, corrosion resistance, insulation, such as silicon, epoxy and resin material, and may be formed in an ultraviolet or heat curing method.

The molding member 138 may include first phosphor and second phosphor different from the first phosphor where each of the first and the second phosphor is configured to convert wavelength of a light generated in the light emitting device 110 differently from each other. The first and the second phosphor different from each other may emit a light having wavelength different from each other, and may convert wavelength of a light generated in the light emitting device 110 so that a white light may be realized in the light emitting device package 100.

According to wavelength of a light emitted from the light emitting device 110, each of the first and the phosphor may include at least one of blue light emitting phosphor, blue-green light emitting phosphor, green light emitting phosphor, yellow-green light emitting phosphor, yellow light emitting phosphor, yellow-red light emitting phosphor, and red light emitting phosphor.

The first and the second phosphor may generate a second light by being excited by a first light emitted from the light emitting device 110 where the second light has different color than the first light.

For example, when the light emitting device 110 is a blue light emitting diode, the molding member 138 containing green light emitting phosphor may be filled in the first cavity 136 and the molding member 138 containing red light emitting phosphor may be filled in the second cavity 137. In such arrangement, the green light emitting phosphor may emit green light by being excited by blue light from the blue light emitting diode, and the red light emitting phosphor may emit red light by being excited by blue light from the blue light emitting diode.

Referring back to FIGS. 1 and 2, the green light emitted from the green light emitting phosphor may be emitted to the outside by being reflected by the first lead frame 121 or the inner surface 134 of the wall portion 133 of the first cavity 136. The red light emitted from the red light emitting phosphor may be emitted to the outside by being reflected by the second lead frame 122 or the inner surface 134 of the wall portion 133 of the second cavity 137. The blue light may be emitted to the outside through the optical member 150. Therefore, each of blue, green and red color light is mixed so that the light emitting device package 100 may realize a white light.

Each of the first and second phosphor is placed in each of the first cavity 136 and the second cavity 137 of the cavity 135 so that a phenomenon in which a light emitted from certain phosphor excites a light emitted from another phosphor is prevented. Therefore the light emitting device package 100 may have high color reproducibility.

The green light emitting phosphor may include at least one selected from a group including nitride-based phosphor, sulfide-based phosphor, silicate-based phosphor, and quantum dot-based phosphor.

The red light emitting phosphor may include at least one selected from a group including nitride-based phosphor, sulfide-based phosphor, fluorinated-based phosphor, and quantum dot-based phosphor.

The type of the phosphor is not limited thereto, the phosphor may include well known phosphor, such as YAG, TAG, Aluminate-based, carbide-based, nitridosilicate-based, borate-based, phosphate-based phosphor.

By adjusting the type and content of the phosphor, color coordinate of the realized white light may be adjusted.

A light diffusion member configured to diffuse a light generated in the light emitting device 110 may be further included in the molding member 138.

For example, the light diffusion member may be provided in a type of metal particle. When the light diffusion member is formed of metal, the efficiency of the light extraction of the light emitting device package 100 may be improved due to surface plasmon resonance.

When a metal layer has a flat surface, the plasmon wave formed by being excited by a light may have a characteristic of not being propagated into the inside or the outside from the metal surface. It may be necessary to release surface plasmon wave to the outside, and thus light diffusion member may have a spherical shape.

For this, metal forming the light diffusion member may be formed of at least one metal easily emitting electron by an external stimulus and having negative dielectric constant, such as gold (Au), silver (Ag), copper (Cu) and aluminum (Al).

The optical member 150 divides an inner space of the body 130 into the plurality of cavities (e.g., the first and the second cavities 136 and 137) so that different phosphor may be placed in the each of the first and the second cavities 136 and 137. Therefore, according to the kind of the phosphor intended to be used, a plurality of optical members 150 may be used.

For example, as illustrated in FIG. 2, the optical member 150 may be disposed on an upper portion of the light emitting device 110 between the wall portions 133 facing to each other to divide the cavity 135 into the first cavity 136 and the second cavity 137.

The position of the optical member 150 is not particularly limited, and the optical member 150 may be disposed in various positions to divide the cavity 135 into a plurality of closed cavities. Here, the closed cavities may mean a closed space in two dimensions. For example, each of the first and the second cavities 135 may have an upper surface thereof open to the exterior as shown in FIG. 1.

The light emitting device 110 may be disposed below the optical member 150 as shown in FIG. 1 in the exemplary embodiment. A portion of a light generated in the light emitting device 110 may be released to the outside by transmitting through an upper portion of the optical member 150, and a portion of the light may be supplied to the molding member 138 disposed on a side of the light emitting device 110 to be converted into a light having different wavelength according to phosphor included in the molding member 138, and then released to the outside.

The optical member 150 may employ non-phosphor optical member 150 formed in a transparent or haze type so that a light generated in the light emitting device 110 is transmitted, but the type of the optical member 150 is not particularly limited.

A height of the optical member 150 may be the same as, higher or lower than that of the wall portion 133 of the body 130. When the optical member 150 is formed to have any height, the molding member 138 is filled to be lower than an upper-most end of the optical member 150 so that phosphor filled in each of the first and the second cavities 136 and 137 are not mixed with each other.

A connection electrode (refer to 125*d* of FIG. 7) transferring electricity when the light emitting device 110 are connected in series may be further included in the optical member 150, a description thereof will be described later in related part.

A portion of a light generated in the light emitting device 110 is directly released through the optical member 150 without reaching a surface of the lead frame 120 so that the absorption of a light having short wavelength by the lead frame 120 may be prevented. Therefore, the light emitting device package 100 having high color reproducibility may be realized.

Figure 4:
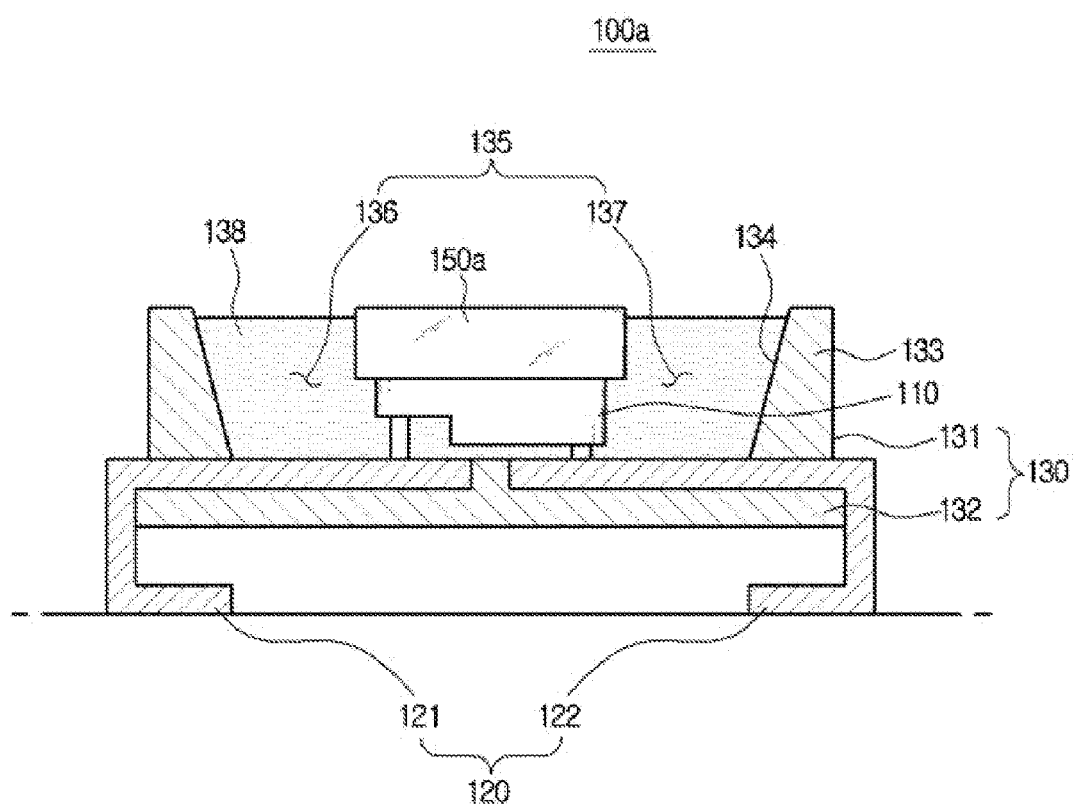
FIGS. 4 and 5 are cross-sectional views illustrating a light emitting device package in accordance with an exemplary embodiment.
Figure 5:
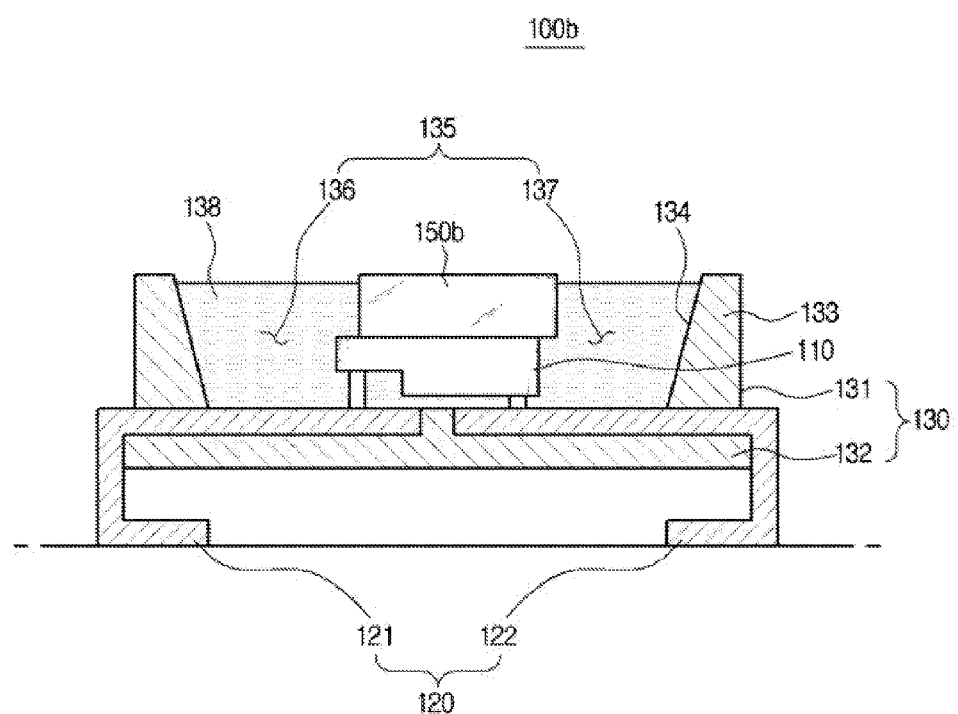

FIGS. 4 and 5 are cross-sectional views illustrating a light emitting device package 100*a* and 100*b* in accordance with an exemplary embodiment.

Referring to FIGS. 4 and 5, a light emitting device package 100*a* and 100*b* includes a light emitting device 110 generating a light, a lead frame 120 electrically connected to the light emitting device 110 and forming at least a portion of a lower surface of a cavity 135, a body 130 in which the light emitting device 110 is accommodated and a plurality of cavities (e.g., the first and the second cavities 136 and 137) are formed, and an optical member 150*a* and 150*b* dividing the body 130 into a plurality of cavities 135.

The configuration of the light emitting device 110, the lead frame 120 and the body 130 is substantially the same as the exemplary embodiment shown in FIG. 1, and thus a description thereof will be omitted.

By adjusting a width of the optical member 150*a* and 150*b*, brightness of a light outputted from the light emitting device package 100*a* may be adjusted.

Referring to FIG. 4, there is a difference in a width of the optical member 150*a* of the light emitting device package 100*a* of FIG. 4 as compared to the optical member 150 of the light emitting device package 100 of FIG. 1.

As illustrated in FIG. 4, a width of the optical member 150*a* is formed to be larger than that of the optical member 150 of the light emitting device 110 so that a light having low brightness may be outputted from the light emitting device package 100a.

Referring to FIG. 5, there is a difference in a width of the optical member 150b of the light emitting device package 100b of FIG. 4 as compared to the optical member 150 of the light emitting device package 100 of FIG. 1.

However, in FIG. 5, the optical member 150b is disposed to cover a portion of the light emitting device 110. That is, an portion of the light emitting device 110 exposed to the first cavity 136 is disposed to be larger than an area of the light emitting device 110 exposed to the second cavity 137 so that a light generated in the light emitting device 110 is supplied more to phosphor in the first cavity 136 than to phosphor in the second cavity.

For example, when green light emitting phosphor is included in the first cavity 136 and red light emitting phosphor is included in the second cavity 137, a green-based white light may be realized. When red light emitting phosphor is included in the first cavity 136 and green light emitting phosphor is included in the second cavity 137, a red-based white light may be realized.

Figure 6:
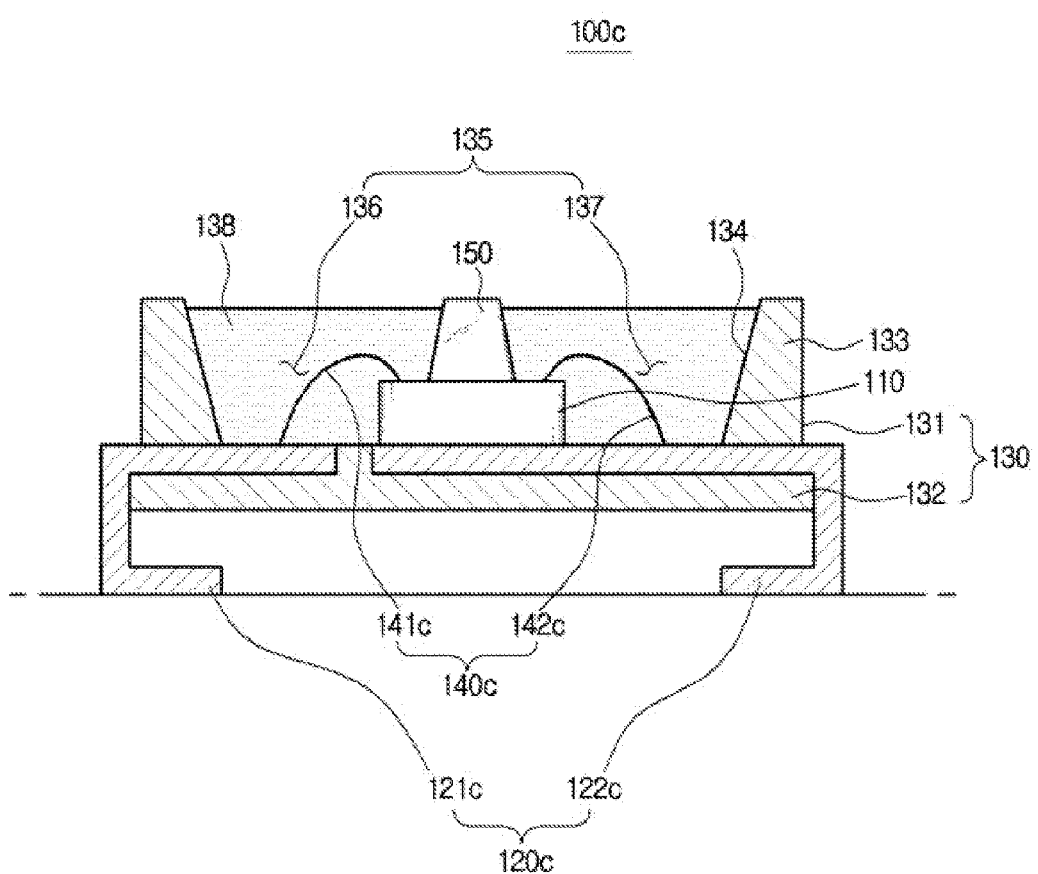
FIG. 6 is a cross-sectional view illustrating a light emitting device package in accordance with an exemplary embodiment.

FIG. 6 is a cross-sectional view illustrating a light emitting device package 100c in accordance with an exemplary embodiment.

Referring to FIG. 6, a light emitting device package 100c includes a light emitting device 110 generating a light, a lead frame 120c including a plurality of lead frames 121c and 122c electrically connected to the light emitting device 110 and forming at least one portion of a lower surface of a cavity 135, a body 130 in which the light emitting device 110 is accommodated and a plurality of cavities (e.g., the first and the second cavities: 136 and 137) are formed, and an optical member 150 dividing the body 130 into a plurality of cavities 136 and 137. The configuration of the light emitting device 110, the lead frame 130 and the optical member 150 is substantially the same as those shown in FIG. 1, and thus a description thereof will be omitted.

Referring to FIG. 6, in comparison with the light emitting device package 100 of FIG. 1, in the light emitting device package 100c of FIG. 6, there are differences in the arrangement and the connection structure of the light emitting device 110 and the lead frame 120c.

More particularly, in the light emitting device package 100 of FIG. 1, the light emitting device 110 is disposed to be across the first lead frame 121 and the second lead frame 122. However, in the light emitting device package 100c of FIG. 6, the light emitting device 110 is disposed only on the second lead frame 122c.

The optical member 150 is disposed on an upper portion of the light emitting device 110 to divide the cavity 135 into the first cavity 136 and the second cavity 137. On the bottom surface of the first cavity 136, a portion of the first lead frame 121c and the second lead frame 122c are exposed, and on the bottom surface of the second cavity 137, a portion of the second lead frame 122c is exposed.

The light emitting device 110 is connected to the lead frame 120c through a bonding wire 140c. For example, the first lead frame 121c may be connected to a first electrode (not shown) of the light emitting device 110 through a first wire 141c, and the second lead frame 122c may be connected to a second electrode (not shown) of the light emitting device 110 through a second wire 142c.

Figure 7:
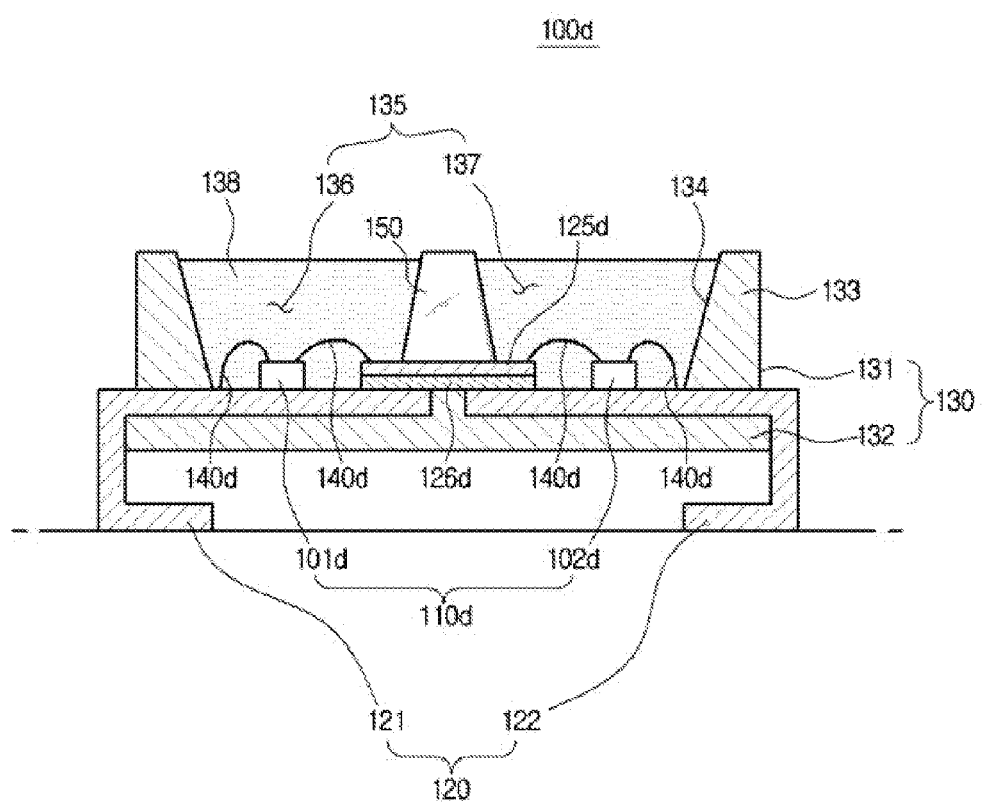
FIG. 7 is a cross-sectional view illustrating a light emitting device package in accordance with an exemplary embodiment.

FIG. 7 is a cross-sectional view illustrating a light emitting device package 100d in accordance with an exemplary embodiment.

Referring to FIG. 7, a light emitting device package 100d includes a plurality of light emitting devices 101d and 102d generating a light, a lead frame 120 electrically connected to the plurality of light emitting devices 101d and 102d and forming at least a portion of a lower surface of a cavity 135, a body 130 in which the light emitting device 110 is accommodated and a plurality of cavities (e.g., a first cavity and a second cavity 136 and 137) are formed, an optical member 150 dividing the body 130 into a plurality of cavities 136 and 137, and a connection electrode 125d. The configuration of the light emitting device 110 and the body 130 is substantially the same as the exemplary embodiment shown in FIG. 1, and thus a description thereof will be omitted.

Referring to FIG. 7, in comparison with the light emitting device package 100 of FIG. 1, there are differences in the number and the arrangement of the light emitting device 110d, and the configuration of the connection electrode 125d.

More particularly, the light emitting device 110d may include a first light emitting device 101d and a second light emitting device 102d. The first light emitting device 101d and the second light emitting device 102d may be disposed in the first cavity 136 and the second cavity 137, respectively, with respect to the optical member 150.

The first light emitting device 101d and the second light emitting device 102d may generate color (i.e., light with different wavelength) different from each other. According to the exemplary embodiment, each of the first light emitting device 101d and the second light emitting device 102d generates a single color light having blue wavelength band, green light emitting phosphor is accommodated in the first cavity 136, and red light emitting phosphor is accommodated in the second cavity 137. In the above-described arrangement, a white light may be realized.

When the plurality of light emitting device 101d and 102d are used, there may be difficulties, such as, the difference in amount of outputted light, due to the difference between characteristics of each of the first and the second light emitting devices 101d and 102d. In order to reduce the difference in the output of light, the first light emitting device 101d and the second light emitting device 102d are connected in series. However, the exemplary embodiment is not limited thereto.

The connection electrode 125d transferring electricity when the light emitting device 110 are connected in series may be disposed below the optical member 150. However, the exemplary embodiment is not limited thereto.

The connection electrode 125d may include at least one selected from a group including conductive material or metal material, such as titanium (Ti), copper (Cu), nickel (Ni), gold (Au), chromium (Cr), tantalum (Ta), platinum (Pt), tin (Sn), is (Ag), phosphorus (P), aluminum (Al), indium (In), palladium (Pd), cobalt (Co), silicon (Si), germanium (Ge), hafnium (Hf), ruthenium (Ru), and iron (Fe). In addition, the connection electrode 125d may be formed to have a single layer structure or a multiple layer structure.

The connection electrode 125d is a medium configured to transfer electricity needed when each light emitting device 110d is connected in series, and thus the connection electrode 125d may include various structures configured to allow the light emitting device 110d to be connected in series.

For example, the connection electrode 125d may be disposed across the first lead frame 121 and the second lead frame 122, and an insulator 126d electrically insulating the connection electrode 125d from the lead frame 120 may be disposed to prevent a short.

The connection electrode 125d and the light emitting device 110d may be electrically connected to each other through a bonding wire 140d. In this case, the connection electrode 125d may have a sufficient area to which the bonding wire 140d is connected.

The connection electrode 125d is disposed on a lower portion of the optical member 150 in the exemplary embodiment. However, the exemplary embodiment is not limited thereto. As illustrated in FIG. 7, when the connection electrode 125d is disposed below the optical member 150, a width of the connection electrode 125d may be a wider than that of the optical member 150 for a bonding space of the bonding wire 140d.

Figure 8:
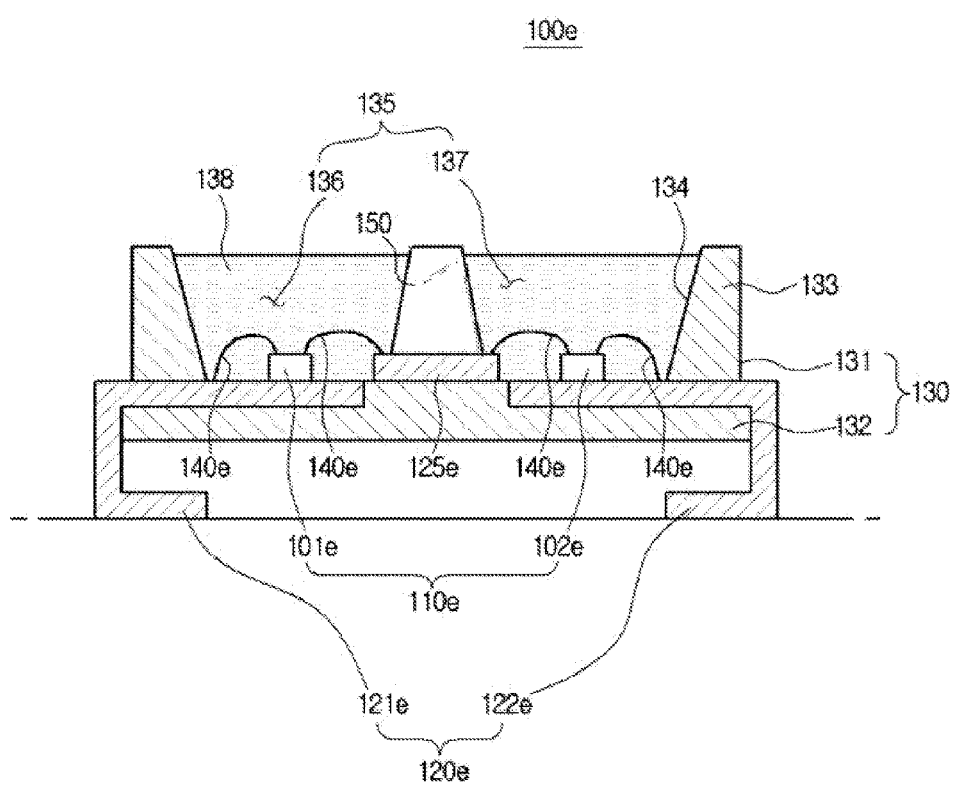
FIG. 8 is a cross-sectional view illustrating a light emitting device package in accordance with an exemplary embodiment.

FIG. 8 is a cross-sectional view illustrating a light emitting device package 100e in accordance with an exemplary embodiment.

Referring to FIG. 8, a light emitting device package 100e includes a plurality of light emitting devices 101e and 102e generating a light, a plurality of lead frames 121e and 122e, a body 130, an optical member 150 and a connection electrode 125d. The configuration of the light emitting device 110e, the body 130, and the optical member 150 is substantially the same as the exemplary embodiment shown in FIG. 7, and thus a description thereof will be omitted.

In comparison with the light emitting device package 100d of FIG. 7, in the light emitting device package 100e of FIG. 8, the insulator 126d is omitted and, there are differences in a shape of the lead frame 120e.

More particularly, the first lead frame 121e and the second lead frame 122e are spaced apart from each other with a wider space compared to the exemplary embodiment shown in FIG. 7, and the connection electrode 125e is disposed below the optical member 150. The lead frame 120e and the connection electrode 125e may be insulated from each other by the lower body 132.

The connection electrode 125e and the light emitting device 110e may be electrically connected to each other through a bonding wire 140e. In this case, the connection electrode 125e may have a sufficient area to which the bonding wire 140e is connected.

The connection electrode 125e may be formed not to be overlapped vertically with the first lead frame 121e and the second lead frame 122e, unlike FIG. 7.

Figure 9:
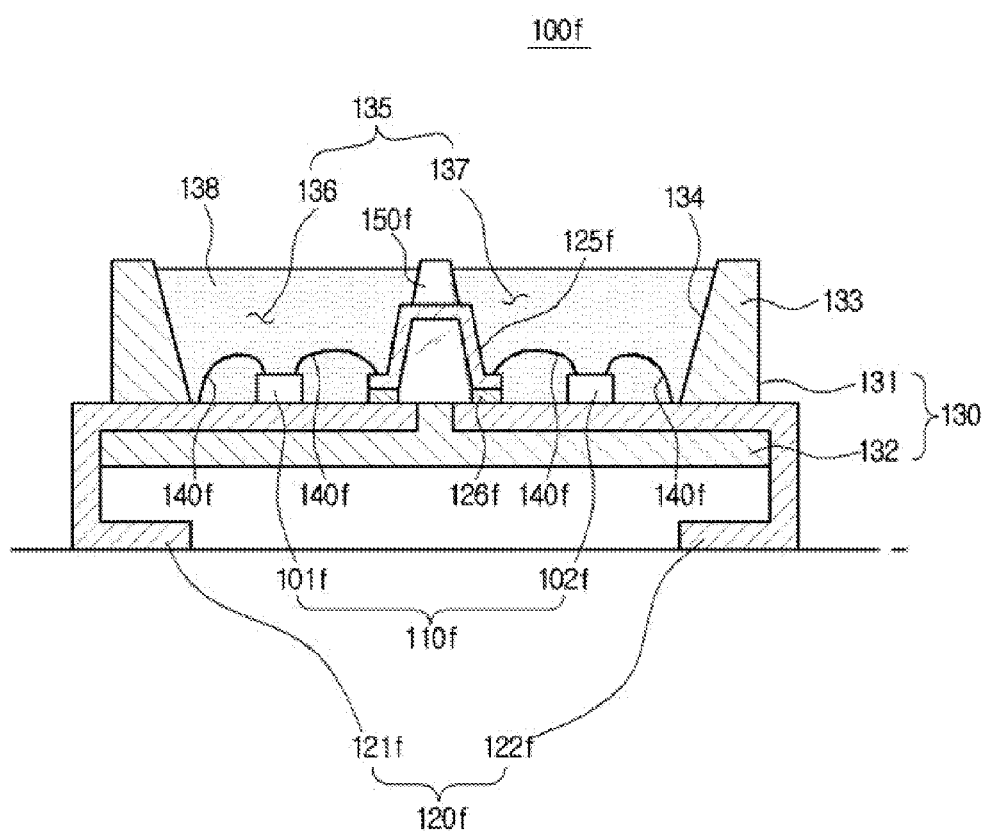
FIG. 9 is a cross-sectional view illustrating a light emitting device package in accordance with an exemplary embodiment.

FIG. 9 is a cross-sectional view illustrating a light emitting device package 100f in accordance with an exemplary embodiment.

Referring to FIG. 9, a light emitting device package 100f includes a plurality of light emitting devices 101f and 102f generating a light, a lead frame 120, a body 130, an optical member 150f and a connection electrode 125f. The configuration of the light emitting device 110f including a first light emitting device 101f and a second light emitting device 102f, the lead frame 120, and the body 130 is substantially the same as those shown in FIG. 7, and thus a description thereof will be omitted.

In comparison with those in FIG. 7, in the light emitting device package 100f of FIG. 9, the connection electrode 125f is disposed below the optical member 150f and has a shape to protrude into the cavity 135. The connection electrode 125f and the light emitting device 110f including the first and the second light emitting devices 101f and 102f may be electrically connected to one another through a plurality of bonding wires 140f.

In this case, an insulator 126f below the connection electrode 125f at both lateral sides of the optical member 150f so as to insulate the connection electrode 125f and the lead frame 120 from each other.

As illustrated in FIG. 9, the connection electrode 125f may be formed to be vertically overlapped with at least one or both of the first lead frame 121 and the second lead frame 122.

Figure 10:
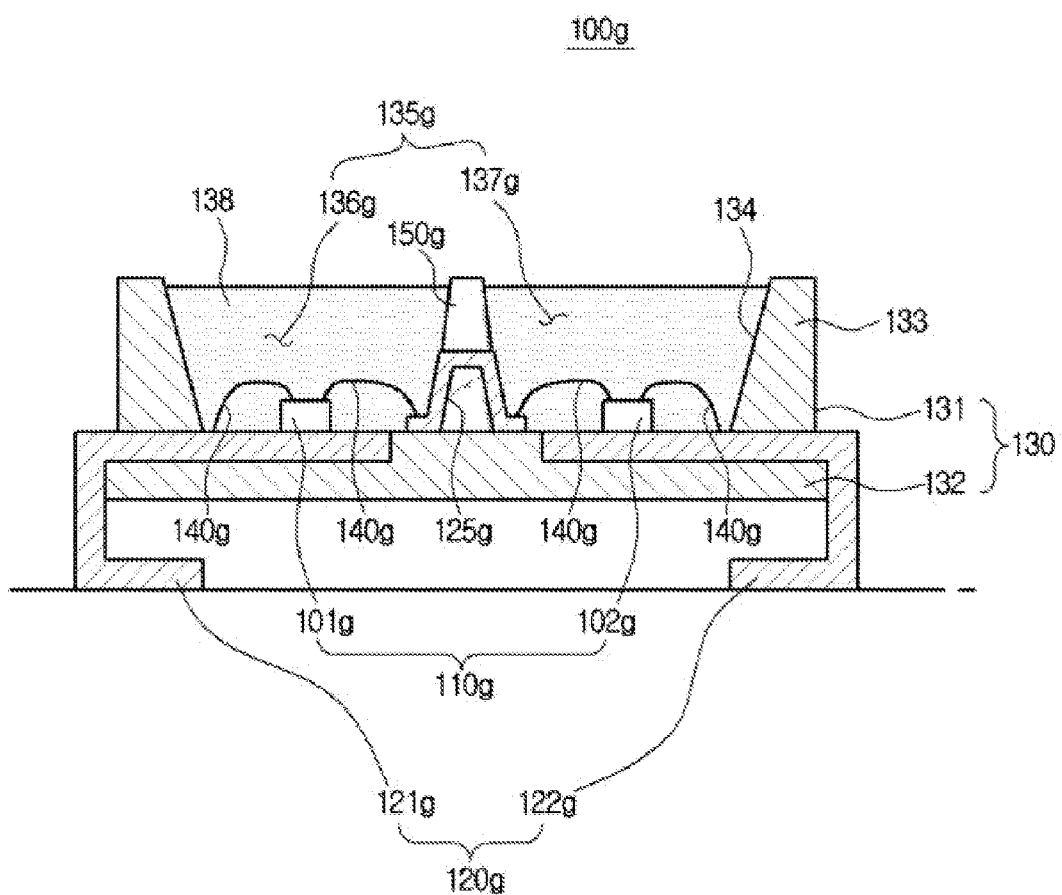
FIG. 10 is a cross-sectional view illustrating a light emitting device package in accordance with an exemplary embodiment.

FIG. 10 is a cross-sectional view illustrating a light emitting device package 100g in accordance with an exemplary embodiment.

Referring to FIG. 10, a light emitting device package 100g includes a light emitting device 110g including a plurality of light emitting devices 101g and 102g generating a light, a lead frame 120g including a plurality of lead frames 121g and 122g, a body 130, an optical member 150g and a connection electrode 125g. The configuration of the light emitting device 110g and the body 130 is practically the same as the exemplary embodiment shown in FIG. 9, and thus a description thereof will be omitted.

In comparison with the light emitting device package 100f of FIG. 9, in the light emitting device package 100g of FIG. 10, the insulator 126f is omitted and, there are differences in a shape of the lead frame 120g.

Referring to FIG. 10, in the light emitting device 110g of FIG. 10, the connection electrode 125g may be disposed below the optical member 150g and protrudes toward the cavity 135g. At this time, the lead frame 120g and the connection electrode 125g may be insulated by a lower body 132 of the body 130 or the optical member 150g.

The connection electrode 125g and the light emitting device 110g may be electrically connected to each other through a bonding wire 140g. In this case, the connection electrode 125g may have a sufficient area to which the bonding wire 140g is connected.

The connection electrode 125g may be formed not to be overlapped vertically with the first lead frame 121g and the second lead frame 122g, unlike FIG. 9.

Figure 11:
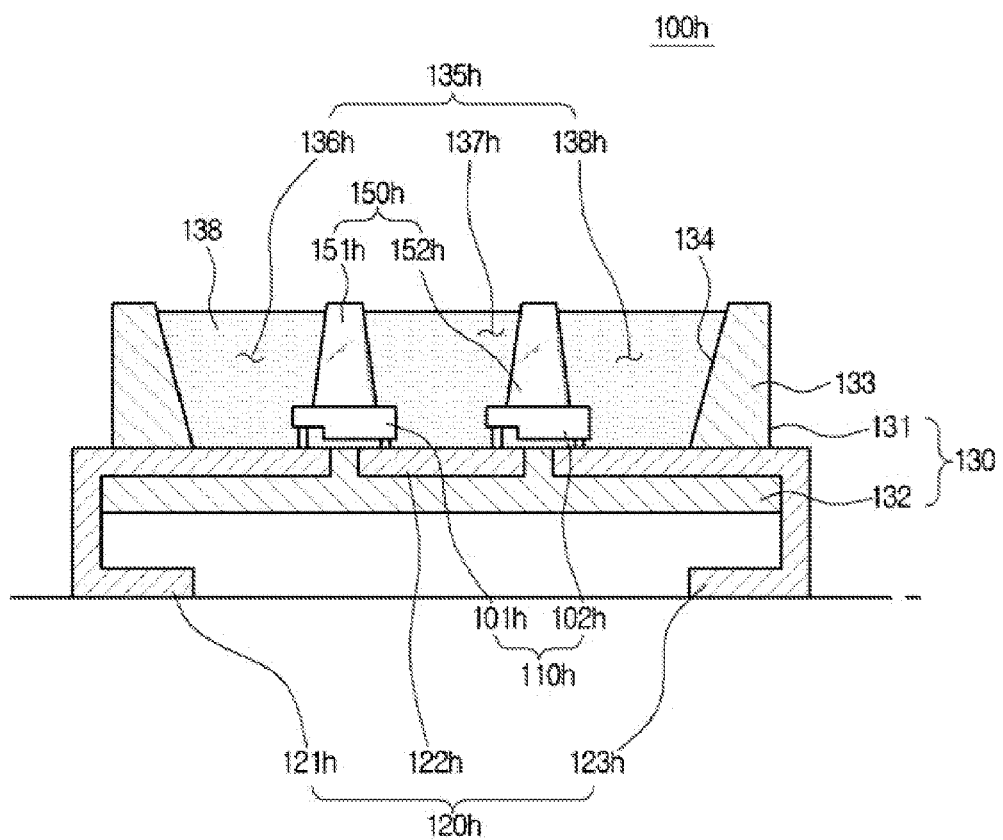
FIG. 11 is a cross-sectional view illustrating a light emitting device package in accordance with an exemplary embodiment.

FIG. 11 is a cross-sectional view illustrating a light emitting device package 100h in accordance with an exemplary embodiment.

Referring to FIG. 11, a light emitting device package 100h includes a light emitting device 110h including a plurality of light emitting devices 101h and 102h generating a light, a lead frame 120h including a plurality of lead frames 121h, 122h and 123h, a body 130, a cavity 135h having a first cavity 136h, a second cavity 137h and a third cavity 138h and an optical member 150h including a first optical member 151h and a second optical member 152h.

In comparison with the light emitting device package 100 of FIG. 1, in the light emitting device package 100h of FIG. 11, a second light emitting device 102h having the second optical member 152h is added to provide the third cavity 138h.

At this time, phosphor different from adjacent phosphor may be accommodated in the first cavity 136h, the second cavity 137h and the third cavity 138h, respectively. More particularly, the molding member 138 filled in each cavity 136h, 137h and 138h may contain phosphor different from the adjacent phosphor.

For example, red light emitting phosphor may be accommodated in the first cavity 136h and the third cavity 138h, and green light emitting phosphor may be accommodated in the second cavity 137h. In this case, a light emitted from the light emitting device package 100h may have a red color.

Meanwhile, green light emitting phosphor may be accommodated in the first cavity 136h and the third cavity 138h, and red light emitting phosphor may be accommodated in the second cavity 137h. In this case, a light emitted from the light emitting device package 100h may have a green color.

Figure 12:
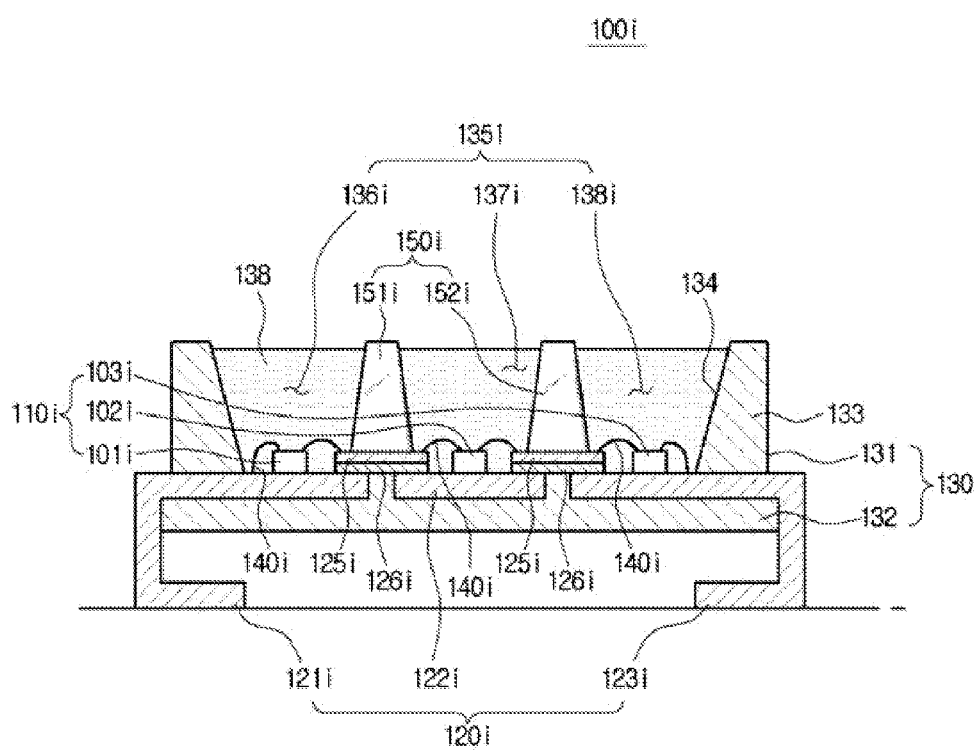
FIG. 12 is a cross-sectional view illustrating a light emitting device package in accordance with an exemplary embodiment.

FIG. 12 is a cross-sectional view illustrating a light emitting device package 100i in accordance with an exemplary embodiment.

Referring to FIG. 12, a light emitting device package 100i includes a light emitting device 110i including a plurality of light emitting devices 101i, 102i and 103i generating a light, a lead frame 120i including a plurality of lead frames 121i, 122i and 123i, a body 130, an optical member 150i including a plurality of optical members 151i and 152i, and a connection electrode 125i.

In comparison with the light emitting device package 100 of FIG. 1, in the light emitting device package 100i of FIG. 12, a second optical member 152i is added to provide a third light emitting device 103i and a third cavity 138i in which the third light emitting device 103i is placed. Each of the plurality of light emitting devices: 101i, 102i and 103i of the light emitting device 110i are mounted to each cavity different from each other 135i: 136i, 137i and 138i, respectively.

As illustrated in FIGS. 11 and 12, by increasing the number of the light emitting device 110h and 110i, the optical characteristics, such as brightness, of the light emitting device package 100h and 100i may be improved. By varying the type and the arrangement of phosphor accommodated in the cavity 135h and 135i, the realized color may be freely adjusted.

Figure 13:
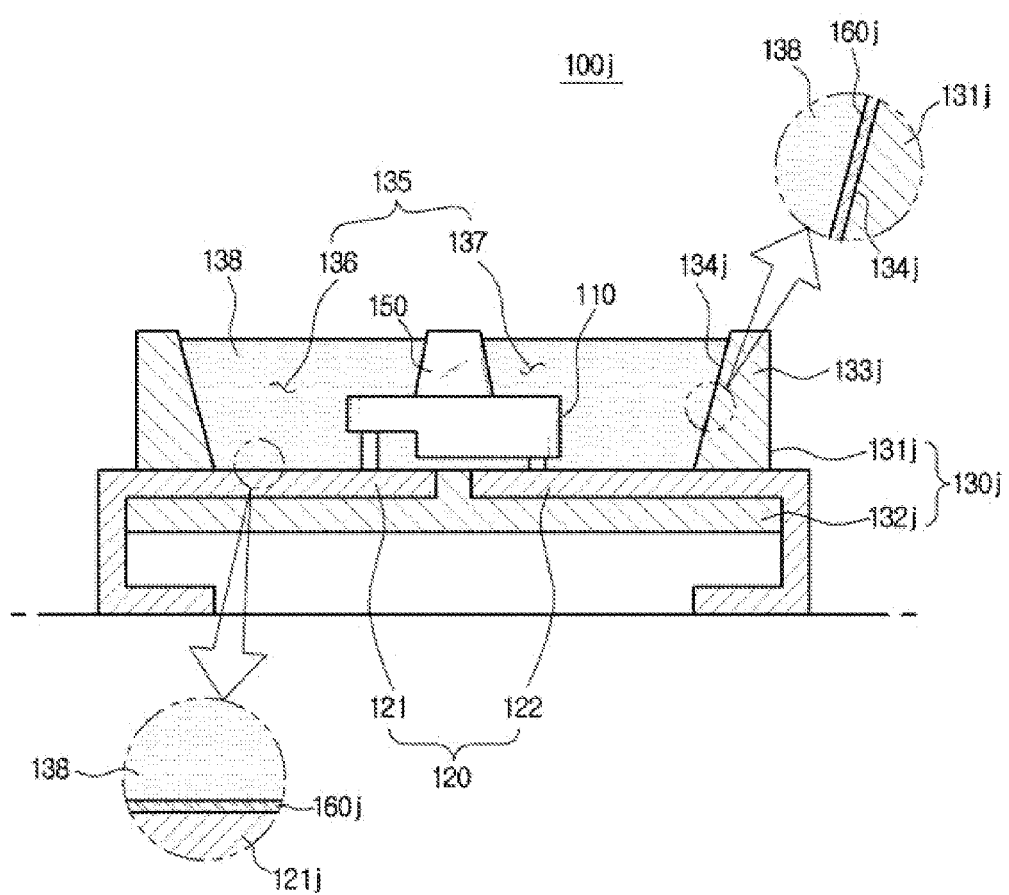
FIG. 13 is a cross-sectional view illustrating a light emitting device package in accordance with an exemplary embodiment.

FIG. 13 is a cross-sectional view illustrating a light emitting device package 100j in accordance with an exemplary embodiment.

Referring to FIG. 13, a light emitting device package 100j includes a light emitting device 110 generating a light, a lead frame 120j, a body 130j, and an optical member 150. The light emitting device 110 and the optical member 150 are the same as the exemplary embodiment shown in the light emitting device package 100 of FIG. 1, and thus a description thereof will be omitted.

In comparison with the light emitting device package 100 of FIG. 1, the light emitting device package 100j of FIG. 13 includes a coating layer 160j having high reflectance to prevent the absorption of a light having short wavelength generated in the light emitting device 110.

For example, the light emitting device package 100j may include the coating layer 160j provided on a wall portion 133j of an upper body 131j or an area in which the lead frame 120j in one surface of the cavity 135 is exposed, but is not limited thereto.

The coating layer 160j may include titanium oxide (TiO2) material. The coating layer 160j according to an exemplary embodiment may be formed in a way that TiO2 is mixed with a medium having characteristics of heating curing or UV curing, such as silicon and epoxy, and the mixed material is applied to an area intended to be coated to be harden.

The lead frame 120j is mainly formed of metal material, and the wall portion 133j is mainly formed of plastic material, wherein such a metal material or plastic material has a high absorption of blue light. When the blue light is absorbed, the light efficiency may be lowered, and thus the brightness may be lowered, in particular the upper body 131j formed of plastic components may be carbonized. Therefore, the wall portion 133j of the upper body 131j is coated with material having high reflectance to improve the reflectance of short wavelength so that brightness and durability of the light emitting device package 100j may be improved.

Hereinbefore various exemplary embodiments of light emitting device package 100, 100a, 100b, 100c, 100d, 100e, 100f, 100g, 100h, 100i, and 100j are described, but an aspect of the present disclosure is not limited thereto.

Hereinafter a display device including the light emitting device package 100 will be described.

Any one of the light emitting device packages 100, 100a, 100b, 100c, 100d, 100e, 100f, 100g, 100h, 100i, and 100j according to the above-described exemplary embodiment may be applied to a display device. The display device may have a structure in which a plurality of light emitting device packages is arranged in an array.

Figure 14:
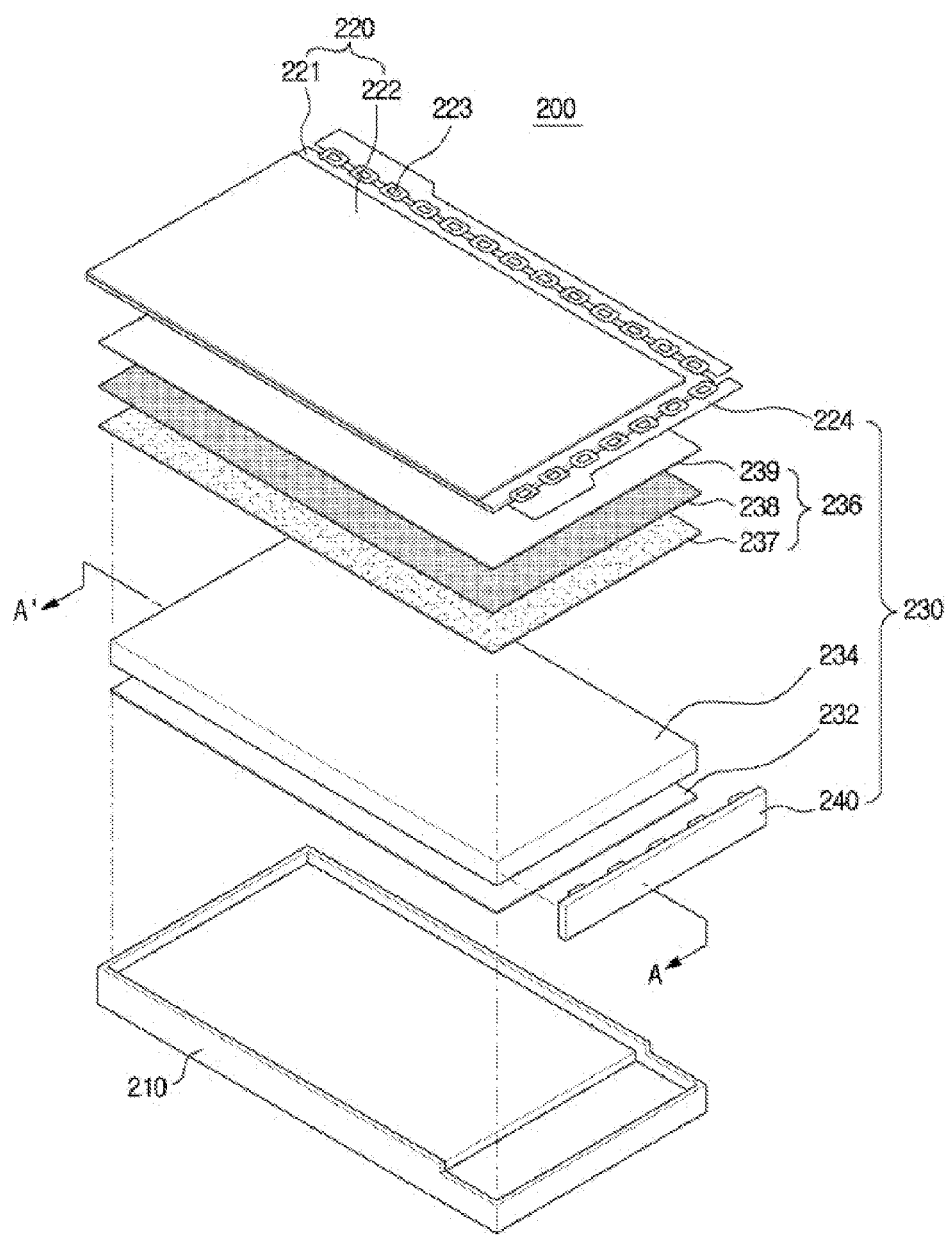
FIG. 14 is an exploded perspective view illustrating a display device in accordance with an exemplary embodiment.
Figure 15:
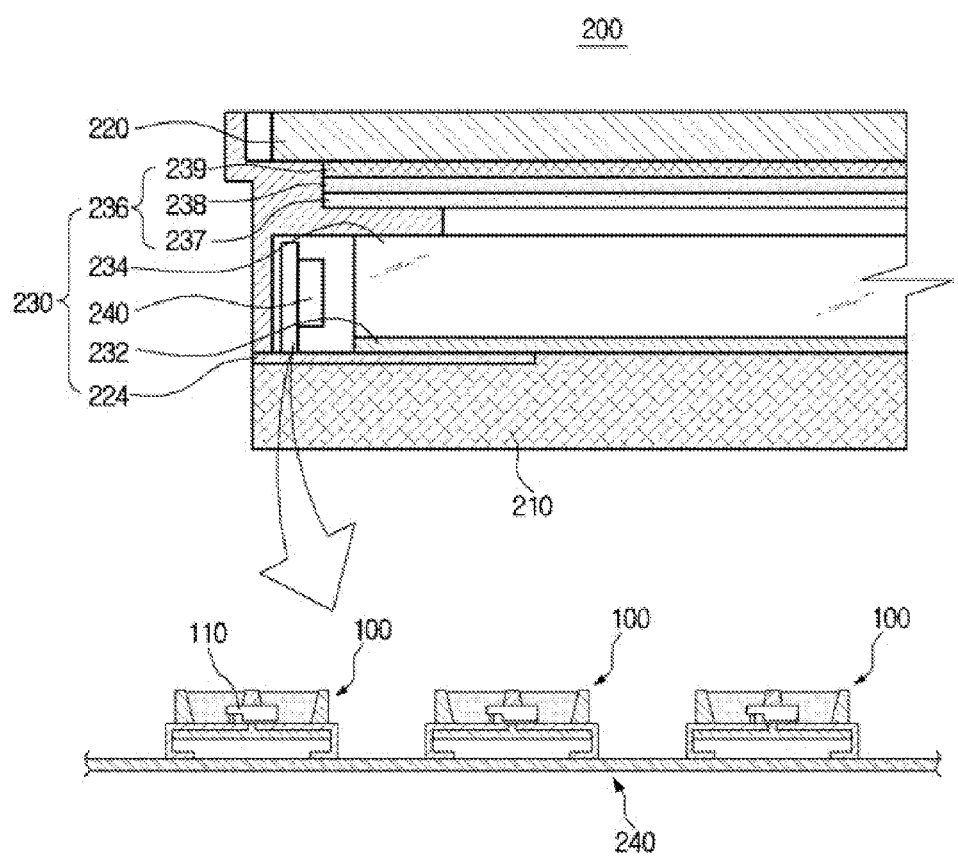
FIG. 15 is a cross-sectional view take along line A-A' of FIG. 14.

FIG. 14 is an exploded perspective view illustrating a display device 200 in accordance with an exemplary embodiment and FIG. 15 is a cross-sectional view of a display device 200 take along line A-A' of FIG. 14.

Referring to FIGS. 14 and 15, a display device 200 according to an exemplary embodiment includes a mold frame 210, a liquid crystal panel 220 and a backlight assembly 230.

The mold frame 210 accommodates the liquid crystal panel 220 and the backlight assembly 230. The mold frame 210 has a rectangular frame shape, and may be formed of plastic material or reinforced plastic material.

A chassis (not shown) surrounding the mold frame 210 and supporting the backlight assembly 230 may be disposed on a lower portion or on a side surface of the mold frame 210. The chassis (not shown) may improve the durability and fire resistance of the mold frame 210.

The liquid crystal panel 220 playing a key role in representing an image may include a first substrate 221 and a second substrate 222 both of which are bonded each other to be faced with respect to a liquid crystal layer (not shown).

Here, although not shown in the drawings, it is assumed that active matrix method is applied. A plurality of pixel area may be defined by the intersection of a plurality of gate lines and a plurality of data lines on the inner surface of the first substrate 221, which is referred to as a lower substrate. A thin film transistor i.e., a switching element may be provided on an intersection point of the gate line and the data line of each pixel area, and the each pixel area is connected to drain electrodes of the thin film transistor so that pixel electrodes may be formed.

At this time, according to driving mode of the display device 200, on the each pixel area, common electrodes other than pixel electrodes may be spaced apart from the pixel electrode on the same layer, or may be overlapped with the pixel electrodes through an insulating layer.

In addition, when the common electrode is placed on the first substrate 221, the common line may be provided in parallel to the gate line, and the common electrode may be electrically connected to the common line.

On the inner surface of the second substrate 222, which is referred to as an upper substrate or a color filer substrate, black matrix covering non-display elements, such as gate lines, data lines, and thin film transistor, and surrounding each color pattern, and color filter corresponding to each pixel area may be provided. The color filter layer may include red (R), green (G), and blue (B) color pattern.

A transparent common electrode selectively overlapped with the color filer layer may be provided in the second substrate 222. The common electrode provided on the second substrate 222 may be omitted when the common electrode is provided on the first substrate 221, otherwise the common electrode provided on the second substrate 222 may be provided.

A polarizing plate (not shown) configured to selectively transmitting only polarized light in a certain direction may be attached on an external surface of each of the first substrate 221 and the second substrate 222.

A printed circuit board 224 may be connected to at least one edge of the liquid crystal panel 220 through a connection member 223, such as Flexible printed circuit board (FPCB), and tape carrier package (TCP). In the process of modulation, the printed circuit board 224 may be closely disposed to be properly tilted on a side surface or a rear surface of the light emitting device package 100 described later to constitute the backlight assembly 230.

As for the liquid crystal panel 220 having those configuration, when the thin film transistor selected according to each gate line by on/off signal of gate driving circuit is turned on, a signal voltage of data driving circuit may be transmitted to each pixel electrode, and an arrangement direction of liquid crystal molecules may be changed by an electric field between the pixel electrode and the common electrode so that the transmittance difference may be represented.

The display device 200 includes a backlight assembly 230 generating a light on a rear surface thereof to express the transmittance difference displaying the liquid crystal panel 220 to the outside.

The backlight assembly 230, which is disposed inside the mold frame 210 to supply a light, may include a plurality of optical sheets 236 configured to effectively supply a light generated from at least one light source to the liquid crystal panel 220 by the optical compensation.

More particularly, the backlight assembly 230 according to an exemplary embodiment may include a reflective sheet 232 disposed on the bottom surface of the inside of the mold frame 210, a light guide plate 234 disposed on an upper surface of the reflective sheet 232, a plurality of optical sheets 236 disposed on an upper portion of the light guide plate 234, a light emitting device package array 240 disposed on a side surface of the light guide plate 234 and including the light emitting device 110, and a printed circuit board 224 to which the light emitting device package array 240 is mounted.

The reflective sheet 232 is disposed on a lower portion of the light guide plate 234 to reflect a light, which is outputted from the light emitting device 110 of the light emitting device package 100, in a direction of the light guide plate 234. More particularly, the reflective sheet 232 may reflect a refracted light in a lower direction to be traveled again toward the light guide plate 234 so as to improve brightness of the light.

The light guide plate 234 is disposed on the reflective sheet 232 and receives a light outputted from the light emitting device 110 to reflect toward the optical sheet 236 through refraction, reflection, and dispersion. The light guide plate 234 may include a light diffusion member to help a light travel, and on a rear surface of the light guide plate 234, a certain pattern or grooves may be formed to distract an incident light.

An incident surface, on which a light outputted from the light emitting device package 100 is incident, is provided on a side of the light guide plate 234. A surface facing the light emitting device package 100 may be the incident surface among side surfaces of the light guide plate 234.

The optical sheet 236 may be provided between the liquid crystal panel 220 and the light guide plate 234 so that a light guided from the light guide plate 234 is diffused and focused to be traveled to the liquid crystal panel 220. The optical sheet 236 may include at least one diffusion sheet 237 and prism sheets 238 and 239. The diffusion sheet 237 may play a role of diffusing a light emitted from the light guide plate 234, and the prism sheet 238 and 239 may play a role of supplying a uniformed light to the liquid crystal panel 220 by focusing the light diffused by the diffusion sheet 237.

A single diffusion sheet 237 may be provided, and the prism sheets may include a first prism sheet 238 and a second prism sheet 239 both of which are vertically crossed in a X-axis and Y-axis directions. The prism sheet may refract a light in the X-axis and Y-axis directions to improve straightness of the light.

The light emitting device package array 240 may be formed in a way that a plurality of light emitting device packages 100 are spaced apart from adjacent light emitting device packages 100 in a certain distance. Each light emitting device package 100 may constitute a point light source, and the light emitting device package array 240 may be disposed on a side of the light guide plate 234 to supply a light to the display device 200.

The light emitting device package array 240 to which a plurality of light emitting device package 100 is mounted may be bonded on the printed circuit board 224.

In FIGS. 14 and 15, a case where the light emitting device package array 240 is disposed on a side surface of the light guide plate 234 is described. However, the exemplary embodiment is not limited thereto. For example, the light emitting device package array 240 may be disposed on both or all sides of the light guide plate 234.

The light emitting device package 100 of FIGS. 1 and 2 may be mounted to the light emitting device package array 240 as shown in FIGS. 14 and 15.

More particularly, a light emitting device package 100 may include a light emitting device 110 generating a light, a body 130 in which the light emitting device 110 is accommodated, an optical member 150 dividing the cavity 135 into a plurality of cavities 136 and 137, and first phosphor and second phosphor different from each other accommodated in each of the plurality of cavities 136 and 137.

For example, the light emitting device 110 may employ a blue light emitting device 110 generating a blue light, and the cavity 135 may be divided into the first cavity 136 and the second cavity 137. green light emitting phosphor is accommodated in the first cavity 136, and red light emitting phosphor is accommodated in the second cavity 137.

The light emitting device package 100 may prevent the phenomenon of re-absorbing a light excited by the green light emitting phosphor by the red light emitting phosphor and may improve brightness of the display device 200 by accommodating each phosphor in the each of the plurality of cavities 136 and 137.

In the exemplary embodiments, a case where the light emitting device package 100 of FIGS. 1 and 2 is employed is described as an example, but various light emitting device packages 100a, 100b, 100c, 100d, 100e, 100f, 100g, 100h, 100i, 100j, individually or in combination, configured to realize a white light may be employed.

Figure 16:
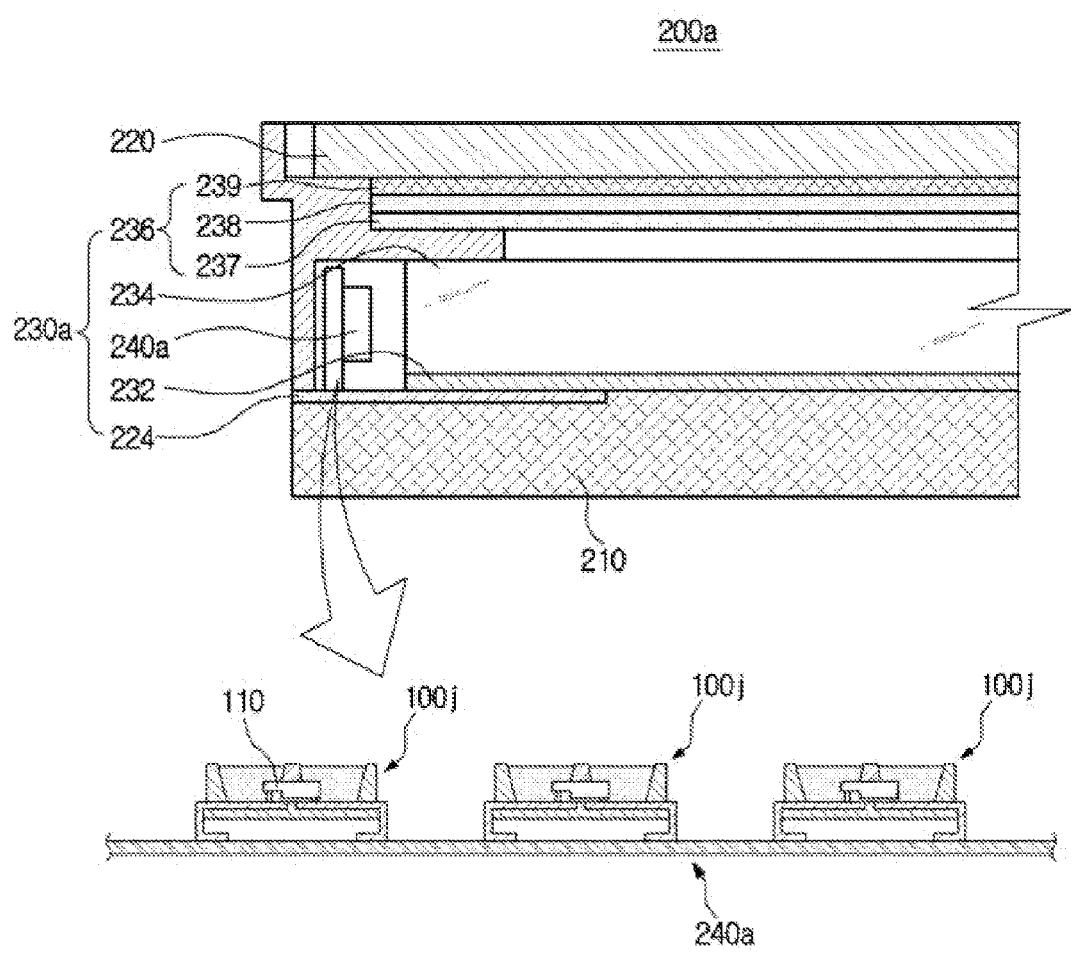
FIG. 16 is a cross-sectional view illustrating a display device in accordance with an exemplary embodiment.

FIG. 16 is a cross-sectional view illustrating a display device 200a in accordance with an exemplary embodiment.

Referring to FIG. 16, a display device 200a according to another exemplary embodiment may include a mold frame 210, a liquid crystal panel 220, and a backlight assembly 230a. The backlight assembly 230a may include a reflective sheet 232 disposed on the bottom surface of the inside of the mold frame 210, a light guide plate 234 disposed on an upper surface of the reflective sheet 232, a plurality of optical sheets 236 disposed on an upper portion of the light guide plate 234, a light emitting device package array 240*a* disposed on a side surface of the light guide plate 234 and including the light emitting device 110, and a printed circuit board 224 to which the light emitting device package array 240 is mounted.

The mold frame 210, the liquid crystal panel 220, the reflective sheet 232, the light guide plate 234, the optical sheet 236, and the printed circuit board 224 are substantially the same as the exemplary embodiments shown in FIGS. 14 and 15, and thus a duplicate description will be omitted.

In comparison with the light emitting device package array 240 of FIGS. 14 and 15, in the display device 200*a* of FIG. 16, there are differences in the configuration of the light emitting device package 100*j* mounted to the light emitting device package array 240*a*.

For example, in the light emitting device package array 240*a* of FIG. 16, the light emitting device package 100*j* as shown in FIG. 13 is disposed to be spaced apart from each other instead of the light emitting device package 100 shown in FIGS. 1 and 2. That is, the light emitting device package 100*j* including a coating layer 160*j* having high reflectance may be mounted to the light emitting device package array 240*a*, and the coating layer 160*j* may include titanium oxide (TiO2) material.

The TiO2 is material having high reflectance for a light having short wavelength, and the coating layer 160*j* including TiO2 is applied to the light emitting device package 100*j* so that it is prevented that a blue light generated in the light emitting device 110 is re-absorbed in the wall portion 133*j* of the light emitting device 110*j* or the lead frame 120*j*. Therefore, brightness of an image realized by the liquid crystal panel 220 may be improved.

Figure 17:
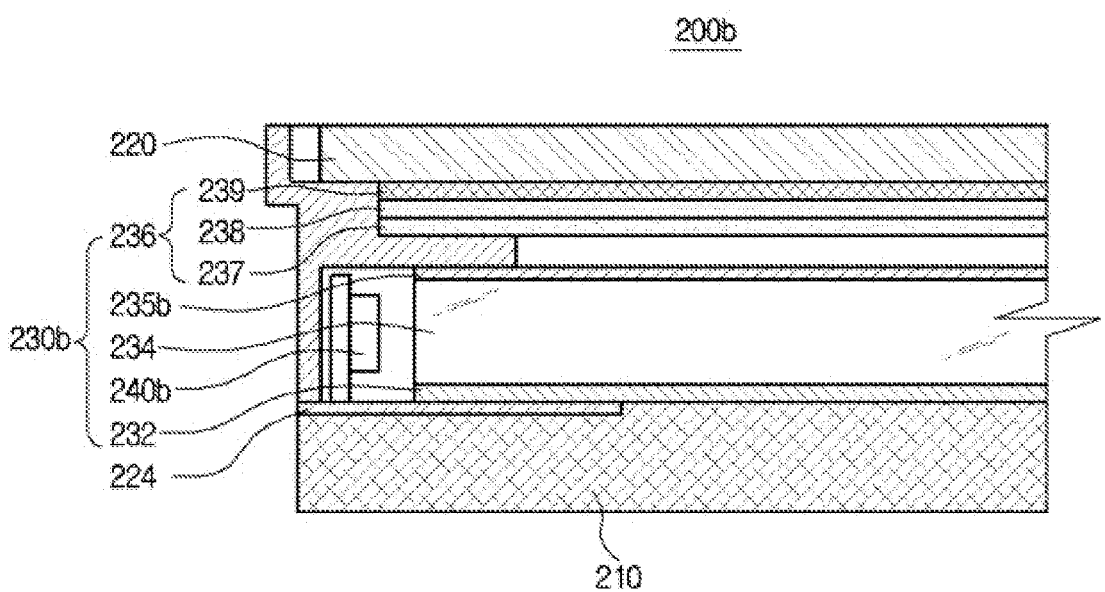
FIG. 17 is a cross-sectional view illustrating a display device in accordance with an exemplary embodiment.

FIG. 17 is a cross-sectional view illustrating a display device 200*b* in accordance with an exemplary embodiment.

Referring to FIG. 17, a display device 200*b* according to another exemplary embodiment may include a mold frame 210, a liquid crystal panel 220, and a backlight assembly 230*b*. The mold frame 210 and the liquid crystal panel 220 are the same as the exemplary embodiments shown in FIGS. 14 and 15, and thus a duplicate description will be omitted.

The backlight assembly 230*b* may include a reflective sheet 232 disposed on the bottom surface of the inside of the mold frame 210, a light guide plate 234 disposed on an upper surface of the reflective sheet 232, a quantum dot sheet 235*b* disposed on an upper surface of the light guide plate 234, a plurality of optical sheets 236 disposed on an upper portion of the quantum dot sheet 235*b*, a light emitting device package array 240*b* disposed on a side surface of the light guide plate 234 and including the light emitting device 110, and a printed circuit board 224 to which the light emitting device package array 240*b* is mounted.

The reflective sheet 232, the optical sheet 236, and the printed circuit board 224 are the same as the exemplary embodiments shown in FIGS. 14 and 15, and thus a duplicate description will be omitted.

In comparison with the display device 220 of FIGS. 14 and 15, the display device 200*b* of FIG. 17 includes the quantum dot sheet 235*b*, and the light emitting device package 100*k* and 100*l* (refer to FIGS. 19 and 20) mounted to the light emitting device package array 240*b* which emits a single color light having blue wavelength band.

The quantum dot sheet 235*b* is formed in a way that quantum dot is processed into a sheet form. For example, the quantum dot sheet 235*b* may allow a green light exited from the light emitting device package array 240 to be realized in a uniform white light.

Figure 18:
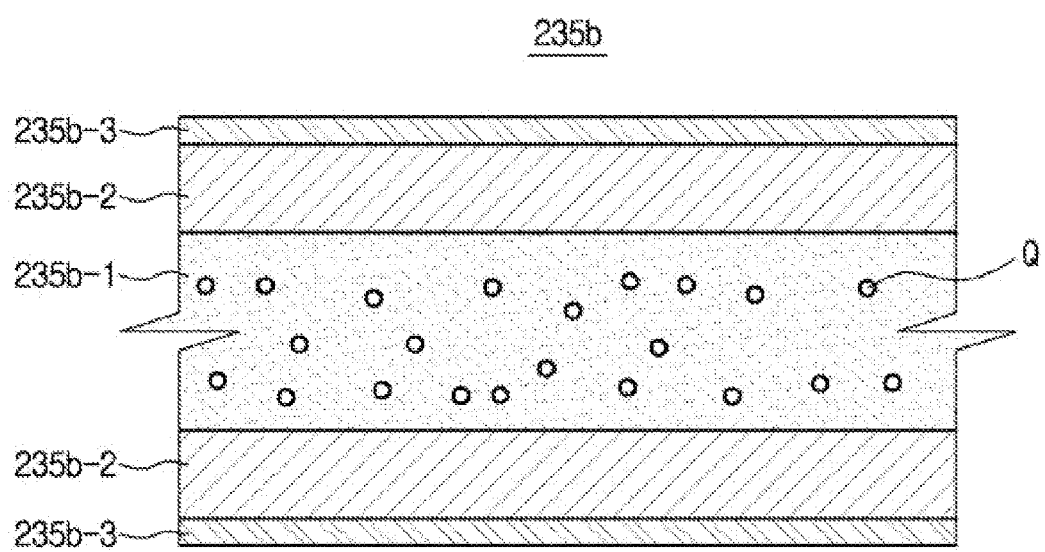
FIG. 18 is a cross-sectional view illustrating a quantum dot sheet in accordance with an exemplary embodiment.

FIG. 18 is a cross-sectional view illustrating a quantum dot sheet 235*b* in accordance with an exemplary embodiment.

Referring to FIG. 18, the quantum dot sheet 235*b* may include a resin layer 235*b*-1 in which quantum dot Q is dispersed, a protective layer 235*b*-2 and a coating layer 235*b*-3 both of which surround the resin layer 235*b*-1. Although not shown, a barrier layer (not shown) may be disposed between the resin layer 235*b*-1 and the protective layer 235*b*-2.

In the resin layer 235*b*-1, a large number of quantum dots Q configured to convert wavelength band of an incident light is injected, and the resin layer 235*b*-1 may be formed of polymer acrylate resin material so that the incident light is transmitted without loss.

When an image displayed on the liquid crystal panel 220 has a blue or a red color, the pixel may be set to be close to white color by adjusting the injection amount of the quantum dots Q.

The protective layer 235*b*-2 may be formed on an upper and a lower surface of the resin layer 235*b*-1. The protective layer 235*b*-2 may protect the resin layer 235*b*-1 from damage caused by the external force. The protective layer 235*b*-2 may be formed of Poly Ethylene Terephthalate (PET).

The coating layer 235*b*-3 may be formed on an upper portion of the upper protective layer 235*b*-2, and on a lower portion of the lower protective layer 235*b*-2. The coating layer 235*b*-3 may diffuse a light passed through the quantum dot sheet 235*b* to be uniformly distributed in the upper direction.

The barrier layer (not shown) may be further included between the resin layer 235*b*-1 and the protective layer 235*b*-2. The barrier layer (not shown) may be formed to minimize that the resin layer 235*b*-1 is oxidized and moisture passes through the resin layer 235*b*-1, and may play a role of complementing the protective layer 235*b*-2.

As mentioned above, the quantum dot sheet 235*b* may have a multiple layer structure, and may transmit a portion of a blue light incident on the incident surface of the light guide plate 234 as it is and may convert the remaining light into a green light and a red light so that finally a white light reaches the liquid crystal panel 220. Particularly, an amount of light incident to the liquid crystal panel 220 may be adjusted according to wavelength bands so that high color reproducibility may be realized.

Unlike the light emitting device package 100 of FIGS. 14 and 15, the light emitting device package 100*k* of FIG. 19 may employ all components configure to output a blue light as discussed below.

Figure 19:
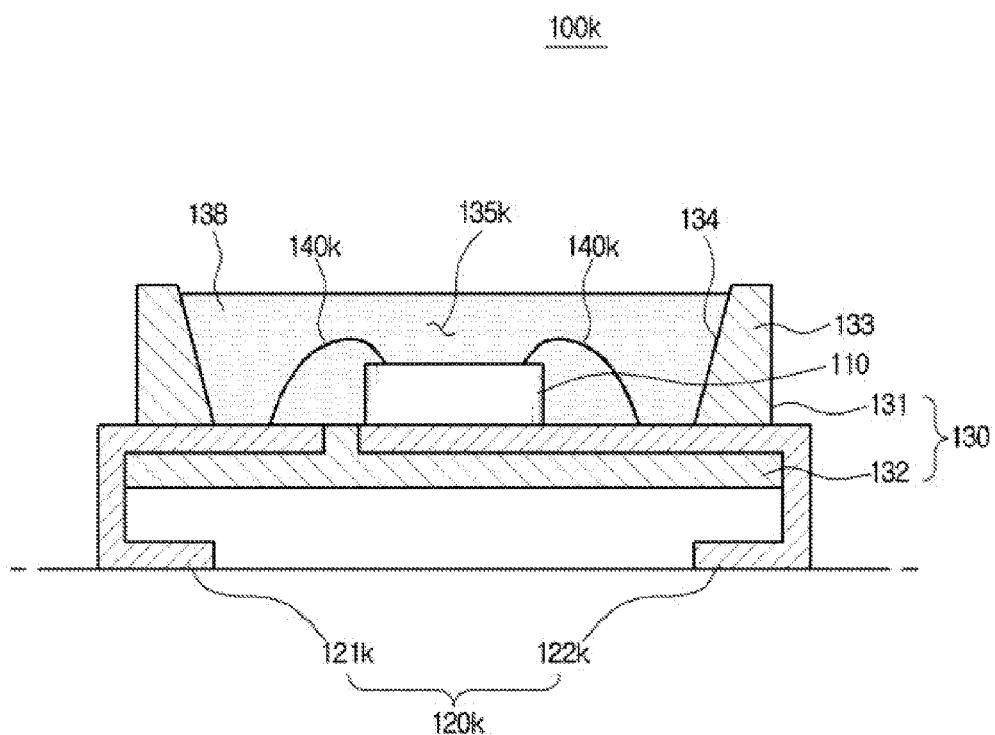
FIG. 19 is a view illustrating a configuration of a light emitting device package in accordance with an exemplary embodiment included in a display device of FIG. 17.
Figure 20:
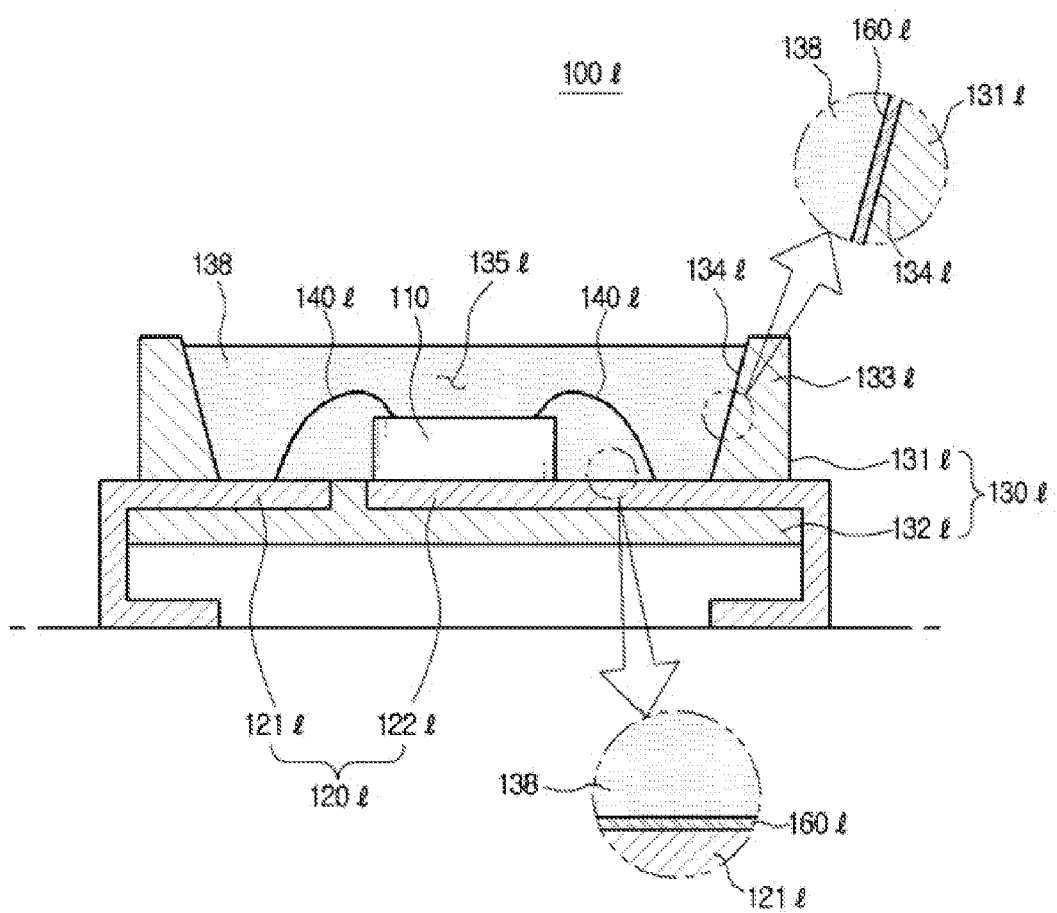
FIG. 20 is a view illustrating a configuration of a light emitting device package in accordance with an exemplary embodiment included in a display device of FIG. 17.

FIG. 19 is a view illustrating a configuration of a light emitting device package 100*k* in accordance with an exemplary embodiment included in a display device 200*b* of FIG. 17 and FIG. 20 is a view illustrating a configuration of a light emitting device package 100*l* in accordance with an exemplary embodiment included in a display device 200*b* of FIG. 17.

Referring to FIG. 19, a light emitting device package 100*k* may include a light emitting device 110 generating a light, a lead frame 120*k* including a plurality of lead frames 121*k* and 122*k*, electrically connected to the light emitting device 110 and forming at least one portion of the bottom surface of the cavity 135, and a body 130 accommodating the light emitting device 110.

The light emitting device 110 may include components configured to generate a light. For example, the light emitting device 110 may include at least one light emitting diode.

In the exemplary embodiment, a light emitting device package 100 outputs a blue light, and thus a light emitting device 110 generating a blue light may be used.

The lead frame 120k is electrically connected to the light emitting device 110 to supply external power to the light emitting device 110.

The lead frame 120k may be formed to have a single layer structure or a multiple layer structure, and as illustrated in drawings, two lead frames 121k and 122k or several lead frames 120k may be mounted. Hereinafter a case where the lead frame 120k includes a first lead frame 121k and a second lead frame 121k will be described as an exemplary embodiment.

The light emitting device 110 may be attached on an upper portion of the first lead frame 121k, an upper portion of the second lead frame 122k, or may be attached across the upper portions of the first lead frame 121k and the second lead frame 122k. When the light emitting device 110 is attached on the upper portion of the first lead frame 121k or the second lead frame 122k, the light emitting device 110 may be electrically connected to the second lead frame 122k or the first lead frame 121k through a wire bond 140k. When the light emitting device 110 is attached across the upper portions of first lead frame 121k and the second lead frame 122k, the light emitting device 110 may be attached on an upper surface of each lead frame 120k by an adhesive layer (not shown).

For convenience of description, FIG. 19 illustrates a case where the light emitting device 110 is attached on an upper portion of the first lead fame 122k and is connected to the first lead fame 121k and the second lead fame 122k through the bonding wire 140k. However, the exemplary embodiment is not limited thereto.

The body 130 may protect the light emitting device 110, and may include an upper body 131 and a lower body 132.

In the upper body 131, a cavity 135k formed in a concave manner having a diameter that gradually decreased while proceeding from an upper portion to a lower portion. In addition, the lead frame 120k is exposed inside the cavity 135k. The cavity 135k may be provided in a single or plural. Hereinafter a case where a single cavity 135k is formed in the body 130 will be described as an exemplary embodiment.

A molding member 138 surrounding the light emitting device 110 to protect from the foreign object may be filled inside the cavity 135k.

The molding member 138 filled in the cavity 135 may be formed to have a shape to cover an upper portion or only a side surface of the light emitting device 110. In addition, the shape of an upper portion thereof may be a convex shape, a flat shape or a concave shape according to the design intent.

The molding member 138 covers and separates the light emitting device 110 from the outside. The molding member 138 covers and separates the light emitting device 110 from the outside to prevent the damage by the foreign object.

The molding member 138 may not include phosphor so that a green light generated in the light emitting device 110 is directly exited without changing the wavelength of the green light. However, as needed, a small amount of phosphor may be included.

Referring to FIG. 20, the light emitting device package 100l may include a coating layer 160l having high reflectance to improve brightness of entire display device by increasing reflectance of a light generated in the light emitting device 110. More particularly, by forming the coating layer 160l on a wall portion 133l surrounding the cavity 135l of an upper body 131l or on a surface of the lead frame 120l, reflectance of a light generated in the light emitting device 110 may be improved.

The molding member 138 of the light emitting device package 100l according to the exemplary embodiment may not include phosphor, as the light emitting device package 100k of FIG. 19. However, as needed, a small amount of phosphor may be included.

In general, when the molding member 138 includes phosphor on the inside thereof, a probability of transmitting a light to the exterior of the light emitting device package 100l may be increased because the light may be diffused by the phosphor present in the molding member. However, when the molding member 138 does not include phosphor inside thereof, a rate of a light trapped in the package may be increased because a light is totally reflected, thereby causing decreasing of the efficiency of the display device 200b.

Therefore, by forming the coating layer 160l on a surface of the light emitting device package 100l, a light may be effectively transmitted to the outside.

Figure 21:
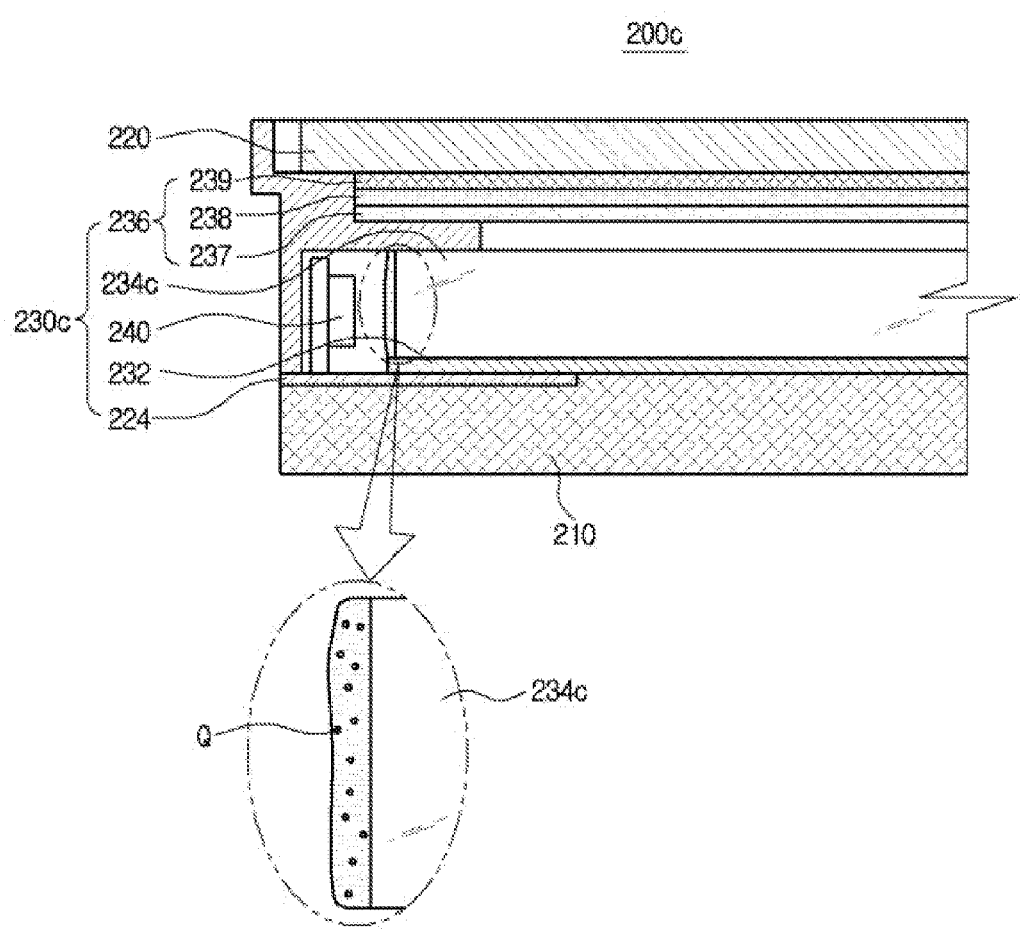
FIG. 21 is a cross-sectional view illustrating a display device in accordance with an exemplary embodiment.

FIG. 21 is a cross-sectional view illustrating a display device 200c in accordance with an exemplary embodiment.

Referring to FIG. 21, a display device 200c may include a mold frame 210, a liquid crystal panel 220, and a backlight assembly 230c. The mold frame 210 and the liquid crystal panel 220 are substantially the same as the exemplary embodiment shown in FIG. 17, and thus a duplicate description will be omitted.

The backlight assembly 230c may include a reflective sheet 232 disposed on the bottom surface of the inside of the mold frame 210, a light guide plate 234c disposed on an upper surface of the reflective sheet 232, a plurality of optical sheets 236 disposed on an upper portion of the light guide plate 234c, a light emitting device package array 240 disposed on a side surface of the light guide plate 234c and including the light emitting device 110 generating a blue light, and a printed circuit board 224 to which the light emitting device package array 240 is mounted.

The reflective sheet 232, the optical sheet 236, and the printed circuit board 224 are practically the substantially same as shown those in FIG. 17, and the light emitting device package array 240 is also substantially the same as shown those in FIG. 17 in term of emitting a single color light having blue wavelength band, and thus a duplicate description will be omitted.

There is difference between the display device 200 of FIG. 17 and the display device 200c of FIG. 21 that quantum dot Q is coated on a surface of the light guide plate 234c of the display device 200c of FIG. 21.

The quantum dot Q may be coated on an incident surface of the light guide plate 234 facing the light emitting device package array 240 outputting a blue light, and the quantum dot Q may be fixed by adhesive material.

By the quantum dot Q coated on the incident surface of the light guide plate 234c, the backlight assembly 230c may realize a white light having excellent optical characteristics. Therefore, although the display device 200c uses a blue color light emitting device package 100 having low color reproducibility as a light source, the color reproducibility may be improved.

Particularly, as for the liquid crystal panel 200c according to the exemplary embodiment, the quantum dot Q is integrally formed with the light guide plate 234c by being coated on the incident surface of the light guide plate 234c, and thus an additional process to provide the quantum dot Q may be omitted.

That is, there are methods of providing the quantum dot Q between the blue light emitting device 110 and the incident surface of the light guide plate 234c to realize a white light having excellent optical characteristics. One is that the quantum dot Q is hardened in a shape of a bar and then the hardened quantum dot Q having a bar shape is attached to the incident surface of the light guide plate 234c by adhesive material, such as a double-sided tape, and another is that a separated quantum dot sheet 235b (refer to FIG. 17) is generated to be disposed between the light guide plate 234c and the optical sheet 236c. However, those processes may be omitted in the display device according to the embodiment of the present disclosure.

In addition, the quantum dot having a hardened bar shape may be easily damaged, but the quantum dot Q according to the embodiment of the present disclosure may avoid such a difficulty.

As mentioned method, a blue color light exited from the light emitting device package array 240 is passed through the quantum dot Q coated on the incident surface of the light guide plate 234c to be emitted as a white light having excellent optical characteristics. The white light is incident into the light guide plate 234c to be total reflected by several times so as to be evenly spread on a wide area of the light guide plate 234c so that a surface light source may be supplied to the liquid crystal panel 220.

Figure 22:
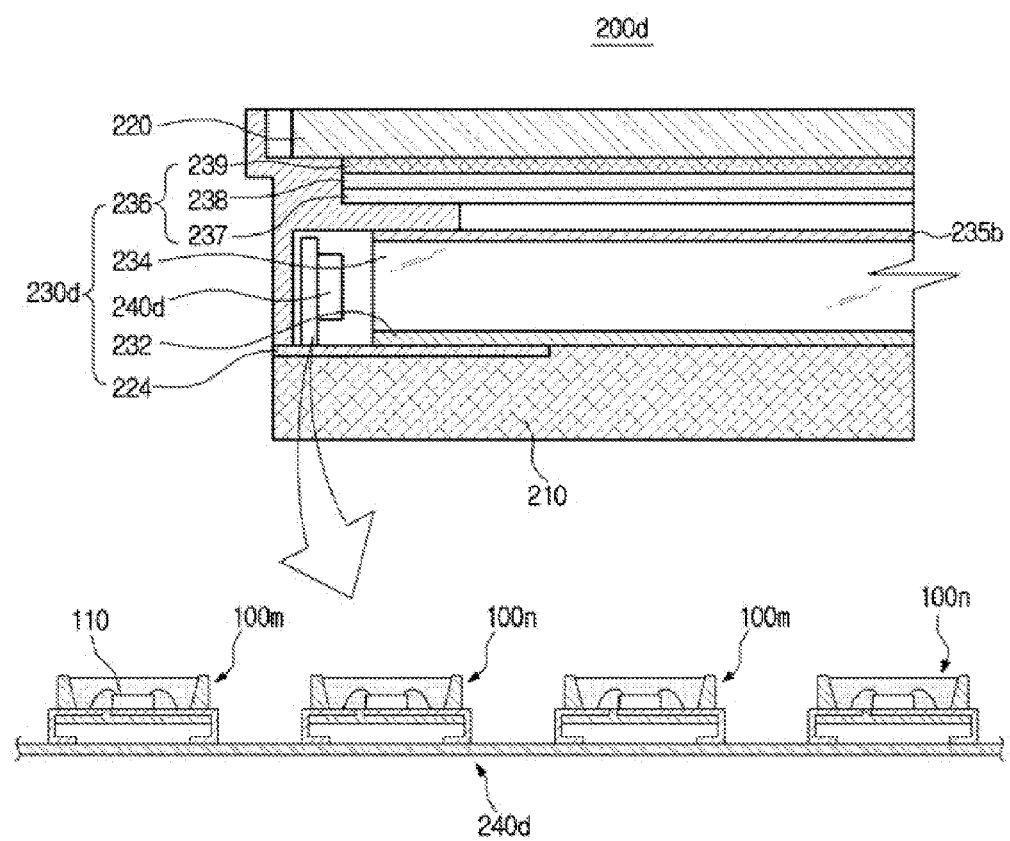
FIG. 22 is a cross-sectional view illustrating a display device in accordance with an exemplary embodiment.

FIG. 22 is a cross-sectional view illustrating a display device 200d in accordance with an exemplary embodiment.

Referring to FIG. 22, a display device 200d may include a mold frame 210, a liquid crystal panel 220, and a backlight assembly 230d. The mold frame 210 and the liquid crystal panel 220 are substantially the same as the exemplary embodiment shown in FIG. 17, and thus a duplicate description will be omitted.

The backlight assembly 230d may include a reflective sheet 232 disposed on the bottom surface of the inside of the mold frame 210, a light guide plate 234 disposed on an upper surface of the reflective sheet 232, a quantum dot sheet 235b disposed on an upper surface of the light guide plate 234, a plurality of optical sheets 236 disposed on an upper portion of the quantum dot sheet 235b, a light emitting device package array 240d disposed on a side surface of the light guide plate 234 and including the light emitting device 110, and a printed circuit board 224 to which the light emitting device package array 240d is mounted.

The reflective sheet 232, the light guide plate 234, the quantum dot sheet 235b, the optical sheet 236 and the printed circuit board 224 are substantially the same as those shown in FIG. 17, and thus a duplicate description will be omitted.

In comparison with the display device 200 of FIG. 17, in the display device 200d of FIG. 22, the light emitting device package 100m and 100n mounted to the light emitting device package array 240d output a single color light having blue wavelength band and a single color light having blue-white wavelength band.

More particularly, in the light emitting device package array 240d, a first light emitting device package 100m outputting a single color light having blue wavelength band and a second light emitting device package 100n outputting a single color light having blue-white wavelength band may be alternately arranged with a certain distance.

The configuration of the first light emitting device package 100m is substantially the same as the light emitting device package 100k and 100l of FIGS. 19 and 20, and thus a duplicate description will be omitted.

The configuration of the second light emitting device package 100n is substantially the same as the light emitting device package 100k and 100l of FIGS. 19 and 20 except that a small amount of phosphor is contained in the molding member 138.

For example, the second light emitting device package 100n may output a single color light having blue-white wavelength band by containing a small amount of green phosphor and a small amount of red phosphor, or a small amount of yellow phosphor in the molding member 138.

Such a configuration is to correct the difference in color sensitivity of the liquid crystal panel 220 generated by placing the quantum dots sheet 235b.

More particularly, as a thickness of the resin layer 235b-1 of the quantum dots sheet 235b becomes thicker, the optical characteristics of the display device 200d may be improved. However, it may be difficult to maintain the properties of the resin layer 235b-1 uniformly in the process of manufacturing of the quantum dot sheet 235i. Therefore, there may be differences in the color sensitivity in each area of the liquid crystal panel 220 due to color shift.

Figure 23:
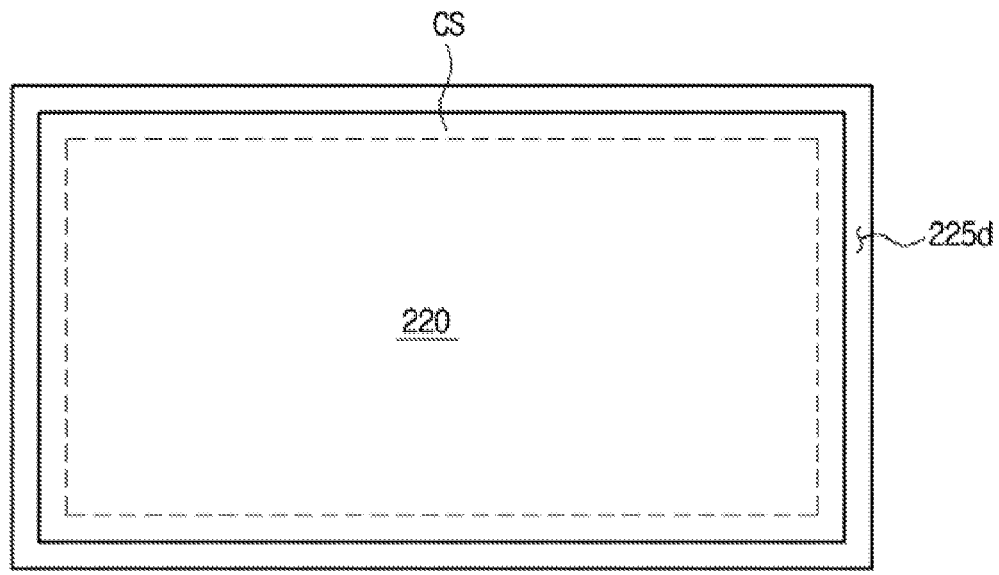
FIGS. 23 and 24 are views illustrating differences in color sensitivity generated in a display device due to color shift.
Figure 24:
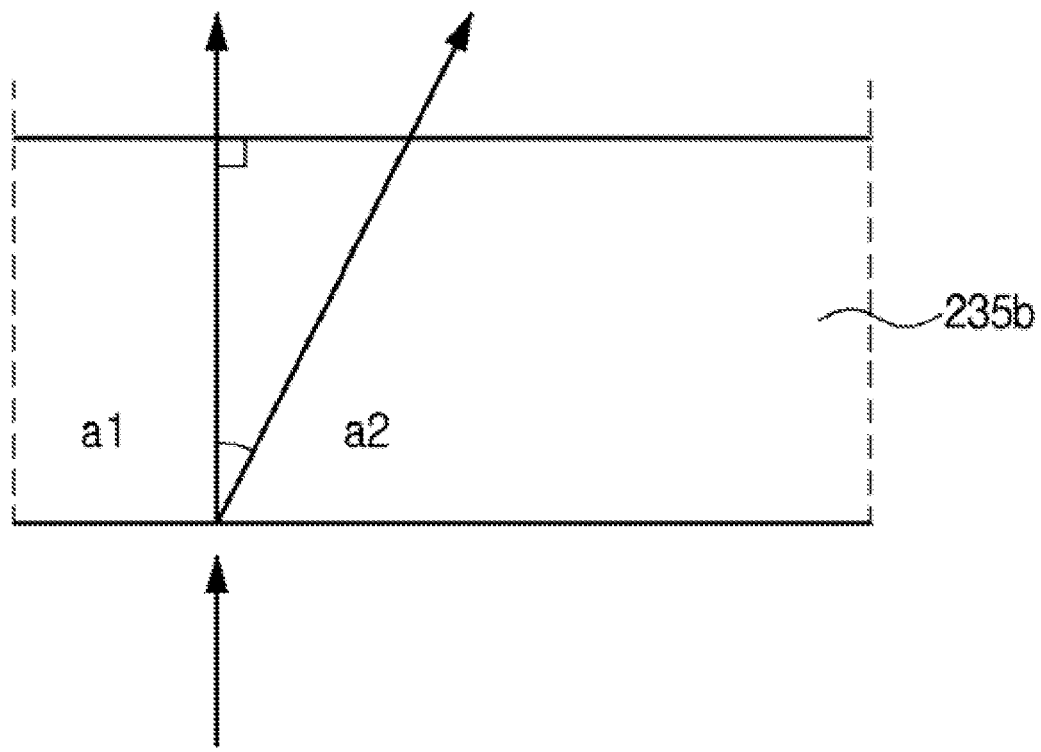

FIGS. 23 and 24 are views illustrating differences in color sensitivity generated in a display device 200d due to color shift.

As illustrated in FIG. 23, when the central area of a single screen displayed by the liquid crystal panel 220 displays the normal color, an image displaying a blue or a red color near the edge area 225d of the display device 200d may be different from the central area due to color shift in a color shift area CS.

This is because components of a light incident on the edge area 225d of the liquid crystal panel 220 are different from that of the central area. For example, light passed through the quantum dot sheet 235b in the edge area 225d may travel in two directions a1 and a2 as illustrated in FIG. 24, and a distance of a light, travelled in the a1 direction, passed through the quantum dot sheet 235b is relatively shorter than that in the a2 direction. Therefore, an image corresponding to light traveling in the a1 direction may have more light having blue wavelength band than the light traveling in the a2 direction to display blue color.

In addition, a narrow bezel structure configured to minimize a width of non-display area, which is an area does not display an image in an edge area, is applied to the recent display device 200d and thus a light may be leaked from a area between the liquid crystal panel 220 and an external frame of a top case. Therefore, there may be difference in the color sensitivity according to the position of the screen.

In the display device 200d according to the exemplary embodiment, although the first light emitting device package 100m and the second light emitting device package 100n of FIG. 22 are alternately arranged, the first light emitting device package 100m and the second light emitting device package 100n are driven by an additional channel so that color shift area cs of the quantum dot sheet 235 may be corrected.

As is apparent from the exemplary embodiments described above, according to the proposed light emitting device package and display device including the same, the absorption of short wavelength by the lead frame may be prevented because a light outputted from the light emitting device is directly outputted toward an upper end through the optical member.

In addition, phosphor different from each other is accommodated in a separated cavity so that a light excited by green phosphor provided in one cavity may be prevented from being re-absorbed by red phosphor provided in another cavity.

While exemplary embodiments have been particularly shown and described above, it would be appreciated by those skilled in the art that various changes may be made therein without departing from the principles and spirit of the inventive concepts defined in the following claims.

What is claimed is:

1. A light emitting device package comprising:
   a light emitting device configured to generate a first light, the light emitting device including a light emitting surface;
   a body configured to accommodate the light emitting device and comprising a cavity in the body;
   an optical member configured to divide the cavity into a plurality of cavities including a first cavity and a second cavity, the optical member including a light transmitting surface extending substantially parallel with the light emitting surface of the light emitting device;
   a molding member provided in the first and second cavities; and
   first phosphor and second phosphor different from the first phosphor accommodated in the first cavity and the second cavity and the first and the second phosphor being mixed in the molding member in the first and second cavities, respectively,
   wherein a first width of the light transmitting surface of the optical member is greater than a second width of the light emitting surface of the light emitting device, and
   wherein the molding member is filled in the first and second cavities to be lower than an upper-most end of the optical member.

2. The light emitting device package of claim 1, wherein the second phosphor is configured to emit a third light having wavelength different from a second light from the first phosphor.

3. The light emitting device package of claim 1, wherein the first phosphor or the second phosphor comprises at least one of green light emitting phosphor and red light emitting phosphor.

4. The light emitting device package of claim 3, wherein the green light emitting phosphor comprises at least one of nitride-based phosphor, sulfide-based phosphor, silicate-based phosphor, and quantum dot-based phosphor.

5. The light emitting device package of claim 3 wherein the red light emitting phosphor comprises at least one of nitride-based phosphor, sulfide-based phosphor, fluorinated-based phosphor, and quantum dot-based phosphor.

6. The light emitting device package of claim 1 wherein the molding member includes silicon, and
   wherein a light emitting surface of the molding member has a shape.

7. The light emitting device package of claim 1, wherein the optical member is provided on the light emitting surface of the light emitting device.

8. The light emitting device package of claim 1, wherein the light emitting device is accommodated in at least one cavity among the plurality of cavities.

9. The light emitting device package of claim 1, wherein the light emitting device is configured to generate a blue light.

10. The light emitting device package of claim 1, wherein the optical member comprises a non-phosphor optical member being a transparent type optical member or a haze type optical member.

11. The light emitting device package of claim 1, wherein the body comprises a coating layer including titanium oxide ($TiO2$) provided on an inner surface of the body forming the cavity.

12. The light emitting device package of claim 1, wherein the light emitting device comprises a plurality of light emitting devices comprising:
    a first light emitting device; and
    a second light emitting device, and
    wherein the first light emitting device and the second light emitting device are provided in the first cavity and the second cavity, respectively.

13. The light emitting device package of claim 1 further comprising a lead frame configured to form the cavity with the body,
    wherein the light emitting device is electrically connected to the lead frame via a bonding wire.

14. A display device comprising:
    a liquid crystal panel;
    a light guide plate provided behind the liquid crystal panel; and
    at least one light emitting device package provided on a side of the light guide plate,
    wherein the at least one light emitting device package comprises:
        a light emitting device configured to generate a light, the light emitting device including a light emitting surface;
        a body configured to accommodate the light emitting device and comprising a cavity in the body;
        an optical member configured to divide the body into a plurality of cavities including a first cavity and a second cavity, the optical member including a light transmitting surface extending substantially parallel with the light emitting surface of the light emitting device;
        a molding member provided in each of the first and second cavities; and
        first phosphor and second phosphor different from the first phosphor accommodated in the first cavity and the second cavity, respectively to be mixed with the molding member,
    wherein a first width of the light transmitting surface of the optical member is greater than a second width of the light emitting surface of the light emitting device, and
    wherein the molding member is filled in the first and second cavities to be lower than an upper-most end of the optical member.

15. The display device of claim 14, wherein the second phosphor is configured to emit a second light having wavelength different from a first light from the first phosphor.

16. The display device of claim 14, wherein the first phosphor or the second phosphor comprises at least one of green light emitting phosphor and red light emitting phosphor.

17. The display device of claim 16, wherein the green light emitting phosphor comprises at least one of nitride-based phosphor, sulfide-based phosphor, silicate-based phosphor, and quantum dot-based phosphor.

18. The display device of claim 16, wherein the red light emitting phosphor comprises at least one of nitride-based phosphor, sulfide-based phosphor, fluorinated-based phosphor, and quantum dot-based phosphor.

19. The display device of claim 14, wherein
    the light emitting device is configured to generate a blue light.

20. The display device of claim 14, wherein the light emitting device comprises a plurality of light emitting devices comprising:
a first light emitting device; and
a second light emitting device, and
wherein the first light emitting device and the second light emitting device are provided in the first cavity and the second cavity, respectively.

21. The display device of claim 14 further comprising a lead frame configured to form the cavity with the body,
wherein the light emitting device is electrically connected to the lead frame via a bonding wire.

22. A light emitting device package comprising:
a light emitting device configured to generate a first light having a first wavelength;
a body comprising a cavity in the body;
an optical member provided in the body, configured to divide the cavity into a plurality of cavities including a first cavity and a second cavity and configured to emit the light in the first wavelength;
first phosphor provided in the first cavity and configured to emit a second light having a second wavelength different from the first wavelength; and
second phosphor provided in the second cavity and configured to emit a third light having a third wavelength different from the first wavelength and the second wavelength,
wherein a first portion of the light emitting device exposed to a first one of the first cavity and the second cavity is larger than a second portion of the light emitting device exposed to a second one different from the first one of the first cavity and the second cavity.

23. The light emitting device package of claim 22, wherein the light having the first wavelength, the light having the second wavelength and the light having the third wavelength are combined to generate a white light.

24. The light emitting device package of claim 22, wherein the first phosphor is provided only in the first cavity amongst the plurality of cavities, and
the second phosphor is provided only in the second cavity amongst the plurality of cavities.

25. The light emitting device package of claim 22, wherein the light emitting device comprises a plurality of light emitting devices comprising:
a first light emitting device; and
a second light emitting device, and
wherein the first light emitting device and the second light emitting device are provided in the first cavity and the second cavity, respectively.

26. The light emitting device package of claim 22 further comprising a lead frame configured to form the cavity with the body,
wherein the light emitting device is electrically connected to the lead frame via a bonding wire.

27. The light emitting device package of claim 22, wherein a first amount of the first phosphor in the first cavity is different from a second amount of the second phosphor in the second cavity.

28. A display device comprising:
a liquid crystal panel;
a light guide plate provided behind the liquid crystal panel; and
at least one light emitting device package provided on a side of the light guide plate,
wherein the at least one light emitting device package comprises:
a light emitting device configured to generate a first light having a first wavelength;
a body comprising a cavity in the body;
an optical member provided in the body, configured to divide the cavity into a plurality of cavities including a first cavity and a second cavity and configured to emit the light in the first wavelength;
a molding member comprising a resin material provided in the cavity;
first phosphor mixed with the molding member in the first cavity and configured to emit a second light having a second wavelength different from the first wavelength; and
second phosphor mixed with the molding member in the second cavity and configured to emit a third light having a third wavelength different from the first wavelength and the second wavelength,
wherein a first portion of the light emitting device exposed to a first one of the first cavity and the second cavity is larger than a second portion of the light emitting device exposed to a second one different from the first one of the first cavity and the second cavity.

29. The display device of claim 28, wherein the light having the first wavelength, the light having the second wavelength and the light having the third wavelength are combined to generate a white light.

30. The display device of claim 28, wherein the first phosphor is provided only in the first cavity amongst the plurality of cavities, and
the second phosphor is provided only in the second cavity amongst the plurality of cavities.

31. The display device of claim 28, wherein a first amount of the first phosphor in the first cavity is different from a second amount of the second phosphor in the second cavity.

* * * * *